(12) United States Patent
Ahn et al.

(10) Patent No.: US 8,399,365 B2
(45) Date of Patent: Mar. 19, 2013

(54) METHODS OF FORMING TITANIUM SILICON OXIDE

(75) Inventors: Kie Y. Ahn, Chappaqua, NY (US); Leonard Forbes, Corvallis, OR (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/323,609

(22) Filed: Dec. 12, 2011

(65) Prior Publication Data

US 2012/0088373 A1    Apr. 12, 2012

Related U.S. Application Data

(63) Continuation of application No. 12/730,951, filed on Mar. 24, 2010, now Pat. No. 8,076,249, which is a continuation of application No. 11/093,104, filed on Mar. 29, 2005, now Pat. No. 7,687,409.

(51) Int. Cl.
   *H01L 21/31* (2006.01)
   *H01L 21/469* (2006.01)

(52) U.S. Cl. ................. 438/763; 257/E21.273

(58) Field of Classification Search ............ 438/763; 257/E21.273
   See application file for complete search history.

(56) References Cited

U.S. PATENT DOCUMENTS

| | | | |
|---|---|---|---|
| 3,357,961 A | 12/1967 | Makowski et al. | |
| 3,381,114 A | 4/1968 | Nakanuma | |
| 4,058,430 A | 11/1977 | Suntola et al. | |
| 4,215,156 A | 7/1980 | Dalal et al. | |
| 4,302,620 A | 11/1981 | Chu | |
| 4,333,808 A | 6/1982 | Bhattacharyya et al. | |
| 4,358,397 A | 11/1982 | Chu | |
| 4,394,673 A | 7/1983 | Thompson et al. | |
| 4,399,424 A | 8/1983 | Rigby | |
| 4,413,022 A | 11/1983 | Suntola et al. | |
| 4,590,042 A | 5/1986 | Drage | |
| 4,647,947 A | 3/1987 | Takeoka et al. | |
| 4,693,211 A | 9/1987 | Ogami et al. | |
| 4,767,641 A | 8/1988 | Kieser et al. | |
| 4,870,923 A | 10/1989 | Sugimoto | |
| 4,902,533 A | 2/1990 | White et al. | |
| 4,920,071 A | 4/1990 | Thomas | |
| 4,940,636 A | 7/1990 | Brock et al. | |
| 4,961,004 A | 10/1990 | Bryan et al. | |
| 4,963,753 A | 10/1990 | Bryan et al. | |
| 4,963,754 A | 10/1990 | Bryan et al. | |

(Continued)

FOREIGN PATENT DOCUMENTS

| EP | 1096042 A1 | 5/2001 |
|---|---|---|
| EP | 1124262 A2 | 8/2001 |

(Continued)

OTHER PUBLICATIONS

Aarik, J., et al., "Atomic layer growth of epitaxial $TiO_2$ thin films from $TiCl_4$ and $H_2O$ on alpha-$Al_2O_3$ substrates", Journal of Crystal Growth, 242(1-2), (2002), 189-198.

(Continued)

*Primary Examiner* — William D Coleman
(74) *Attorney, Agent, or Firm* — Schwegman, Lundberg & Woessner, P.A.

(57) ABSTRACT

A dielectric containing a titanium silicon oxide film and a method of fabricating such a dielectric provide a dielectric for use in a variety of electronic devices. Embodiments may include a dielectric containing a titanium silicon oxide film arranged as one or more monolayers. Embodiments may include structures for capacitors, transistors, memory devices, and electronic systems with dielectrics containing a titanium silicon oxide film, and methods for forming such structures.

20 Claims, 5 Drawing Sheets

U.S. PATENT DOCUMENTS

| | | | |
|---|---|---|---|
| 4,967,085 A | 10/1990 | Bryan et al. |
| 4,967,087 A | 10/1990 | Bryan et al. |
| 4,972,086 A | 11/1990 | Bryan et al. |
| 4,972,516 A | 11/1990 | Bryan et al. |
| 4,975,014 A | 12/1990 | Rufin et al. |
| 4,975,588 A | 12/1990 | Bryan et al. |
| 4,980,559 A | 12/1990 | Bryan et al. |
| 4,980,560 A | 12/1990 | Bryan et al. |
| 4,983,847 A | 1/1991 | Bryan et al. |
| 4,988,880 A | 1/1991 | Bryan et al. |
| 4,990,282 A | 2/1991 | Bryan et al. |
| 4,992,205 A | 2/1991 | Bryan et al. |
| 4,993,358 A | 2/1991 | Mahawili |
| 4,994,205 A | 2/1991 | Bryan et al. |
| 4,996,003 A | 2/1991 | Bryan et al. |
| 5,006,192 A | 4/1991 | Deguchi |
| 5,008,034 A | 4/1991 | Bryan et al. |
| 5,017,791 A | 5/1991 | Bryan et al. |
| 5,055,319 A | 10/1991 | Bunshah et al. |
| 5,075,536 A | 12/1991 | Towe et al. |
| 5,084,606 A | 1/1992 | Bailey et al. |
| 5,095,218 A | 3/1992 | Bryan et al. |
| 5,274,249 A | 12/1993 | Xi et al. |
| 5,304,622 A | 4/1994 | Ikai et al. |
| 5,426,603 A | 6/1995 | Nakamura et al. |
| 5,478,653 A | 12/1995 | Guenzer |
| 5,562,952 A | 10/1996 | Nakahigashi et al. |
| 5,572,052 A | 11/1996 | Kashihara et al. |
| 5,595,606 A | 1/1997 | Fujikawa et al. |
| 5,646,583 A | 7/1997 | Seabury et al. |
| 5,674,563 A | 10/1997 | Tarui et al. |
| 5,698,022 A | 12/1997 | Glassman et al. |
| 5,729,047 A | 3/1998 | Ma |
| 5,735,960 A | 4/1998 | Sandhu et al. |
| 5,795,808 A | 8/1998 | Park |
| 5,801,105 A | 9/1998 | Yano et al. |
| 5,810,923 A | 9/1998 | Yano et al. |
| 5,822,256 A | 10/1998 | Bauer et al. |
| 5,828,080 A | 10/1998 | Yano et al. |
| 5,840,897 A | 11/1998 | Kirlin et al. |
| 5,912,797 A | 6/1999 | Schneemeyer et al. |
| 5,916,365 A | 6/1999 | Sherman |
| 5,950,925 A | 9/1999 | Fukunaga et al. |
| 5,962,959 A | 10/1999 | Iwasaki et al. |
| 5,990,605 A | 11/1999 | Yoshikawa et al. |
| 6,013,553 A | 1/2000 | Wallace et al. |
| 6,020,024 A | 2/2000 | Maiti et al. |
| 6,020,243 A | 2/2000 | Wallace et al. |
| 6,022,787 A | 2/2000 | Ma |
| 6,023,124 A | 2/2000 | Chuman et al. |
| 6,023,125 A | 2/2000 | Yoshikawa et al. |
| 6,025,627 A | 2/2000 | Forbes et al. |
| 6,027,961 A | 2/2000 | Maiti et al. |
| 6,034,015 A | 3/2000 | Lin et al. |
| 6,057,271 A | 5/2000 | Kenjiro et al. |
| 6,059,885 A | 5/2000 | Ohashi et al. |
| 6,060,755 A | 5/2000 | Ma et al. |
| 6,066,922 A | 5/2000 | Iwasaki |
| 6,093,944 A | 7/2000 | VanDover |
| 6,103,419 A | 8/2000 | Saidi et al. |
| 6,110,529 A | 8/2000 | Gardiner et al. |
| 6,125,062 A | 9/2000 | Ahn et al. |
| 6,130,503 A | 10/2000 | Negishi et al. |
| 6,137,025 A | 10/2000 | Ebbinghaus et al. |
| 6,141,238 A | 10/2000 | Forbes et al. |
| 6,141,260 A | 10/2000 | Ahn et al. |
| 6,144,155 A | 11/2000 | Yoshikawa et al. |
| 6,147,443 A | 11/2000 | Yoshikawa et al. |
| 6,150,724 A | 11/2000 | Wenzel et al. |
| 6,161,500 A | 12/2000 | Kopacz et al. |
| 6,166,487 A | 12/2000 | Negishi et al. |
| 6,171,900 B1 | 1/2001 | Sun |
| 6,174,809 B1 | 1/2001 | Kang et al. |
| 6,184,612 B1 | 2/2001 | Negishi et al. |
| 6,203,613 B1 | 3/2001 | Gates et al. |
| 6,206,972 B1 | 3/2001 | Dunham |
| 6,207,522 B1 | 3/2001 | Hunt et al. |
| 6,207,589 B1 | 3/2001 | Ma et al. |
| 6,211,035 B1 | 4/2001 | Moise et al. |
| 6,225,168 B1 | 5/2001 | Gardner et al. |
| 6,225,237 B1 | 5/2001 | Vaartstra |
| 6,259,198 B1 | 7/2001 | Yanagisawa et al. |
| 6,270,835 B1 | 8/2001 | Hunt et al. |
| 6,274,937 B1 | 8/2001 | Ahn et al. |
| 6,278,230 B1 | 8/2001 | Yoshizawa et al. |
| 6,281,042 B1 | 8/2001 | Ahn et al. |
| 6,281,144 B1 | 8/2001 | Cleary et al. |
| 6,285,123 B1 | 9/2001 | Yamada et al. |
| 6,289,842 B1 | 9/2001 | Tompa |
| 6,291,341 B1 | 9/2001 | Sharan et al. |
| 6,294,813 B1 | 9/2001 | Forbes et al. |
| 6,296,943 B1 | 10/2001 | Watanabe |
| 6,297,103 B1 | 10/2001 | Ahn et al. |
| 6,297,539 B1 | 10/2001 | Ma et al. |
| 6,302,964 B1 | 10/2001 | Umotoy et al. |
| 6,303,481 B2 | 10/2001 | Park |
| 6,313,035 B1 | 11/2001 | Sandhu et al. |
| 6,313,518 B1 | 11/2001 | Ahn et al. |
| 6,316,873 B1 | 11/2001 | Ito et al. |
| 6,320,091 B1 | 11/2001 | Ebbinghaus et al. |
| 6,331,465 B1 | 12/2001 | Forbes et al. |
| 6,337,805 B1 | 1/2002 | Forbes et al. |
| 6,346,477 B1 | 2/2002 | Kaloyeros et al. |
| 6,350,704 B1 | 2/2002 | Ahn et al. |
| 6,355,561 B1 | 3/2002 | Sandhu et al. |
| 6,365,470 B1 | 4/2002 | Maeda |
| 6,368,941 B1 | 4/2002 | Chen et al. |
| 6,380,579 B1 | 4/2002 | Nam et al. |
| 6,387,712 B1 | 5/2002 | Yano et al. |
| 6,388,376 B1 | 5/2002 | Negishi et al. |
| 6,391,769 B1 | 5/2002 | Lee et al. |
| 6,392,257 B1 | 5/2002 | Ramdani et al. |
| 6,400,070 B1 | 6/2002 | Yamada et al. |
| 6,404,027 B1 | 6/2002 | Hong et al. |
| 6,404,124 B1 | 6/2002 | Sakemura et al. |
| 6,407,435 B1 | 6/2002 | Ma et al. |
| 6,420,230 B1 | 7/2002 | Derderian et al. |
| 6,420,279 B1 | 7/2002 | Ono et al. |
| 6,429,237 B1 | 8/2002 | Tooley |
| 6,432,779 B1 | 8/2002 | Hobbs et al. |
| 6,433,993 B1 | 8/2002 | Hunt et al. |
| 6,441,417 B1 | 8/2002 | Zhang et al. |
| 6,444,039 B1 | 9/2002 | Nguyen |
| 6,444,592 B1 | 9/2002 | Ballantine et al. |
| 6,445,023 B1 | 9/2002 | Vaartstra et al. |
| 6,448,192 B1 | 9/2002 | Kaushik |
| 6,451,641 B1 | 9/2002 | Halliyal et al. |
| 6,451,695 B2 | 9/2002 | Sneh |
| 6,452,229 B1 | 9/2002 | Krivokapic |
| 6,454,912 B1 | 9/2002 | Ahn et al. |
| 6,458,701 B1 | 10/2002 | Chae et al. |
| 6,461,436 B1 | 10/2002 | Campbell et al. |
| 6,465,334 B1 | 10/2002 | Buynoski et al. |
| 6,472,803 B1 | 10/2002 | Yoshizawa et al. |
| 6,492,288 B2 | 12/2002 | Shindo |
| 6,495,436 B2 | 12/2002 | Ahn et al. |
| 6,504,214 B1 | 1/2003 | Yu et al. |
| 6,509,280 B2 | 1/2003 | Choi |
| 6,514,820 B2 | 2/2003 | Ahn et al. |
| 6,514,828 B2 | 2/2003 | Ahn et al. |
| 6,518,610 B2 | 2/2003 | Yang et al. |
| 6,521,911 B2 | 2/2003 | Parsons et al. |
| 6,527,866 B1 | 3/2003 | Matijasevic et al. |
| 6,531,354 B2 | 3/2003 | Maria et al. |
| 6,534,357 B1 | 3/2003 | Basceri |
| 6,534,420 B2 | 3/2003 | Ahn et al. |
| 6,537,613 B1 | 3/2003 | Senzaki et al. |
| 6,541,353 B1 | 4/2003 | Sandhu et al. |
| 6,544,846 B2 | 4/2003 | Ahn et al. |
| 6,544,875 B1 | 4/2003 | Wilk |
| 6,551,893 B1 | 4/2003 | Zheng et al. |
| 6,551,929 B1 | 4/2003 | Kori et al. |
| 6,552,383 B2 | 4/2003 | Ahn et al. |
| 6,552,388 B2 | 4/2003 | Wilk et al. |
| 6,559,014 B1 | 5/2003 | Jeon |
| 6,559,472 B2 | 5/2003 | Sandhu et al. |
| 6,562,491 B1 | 5/2003 | Jeon |

| Patent | Date | Inventor |
|---|---|---|
| 6,566,147 B2 | 5/2003 | Basceri et al. |
| 6,570,248 B1 | 5/2003 | Ahn et al. |
| 6,573,199 B2 | 6/2003 | Sandhu et al. |
| 6,586,349 B1 | 7/2003 | Jeon et al. |
| 6,586,792 B2 | 7/2003 | Ahn et al. |
| 6,592,942 B1 | 7/2003 | Van Wijck |
| 6,596,636 B2 | 7/2003 | Sandhu et al. |
| 6,602,338 B2 | 8/2003 | Chen et al. |
| 6,608,378 B2 | 8/2003 | Ahn et al. |
| 6,613,656 B2 | 9/2003 | Li |
| 6,613,702 B2 | 9/2003 | Sandhu et al. |
| 6,617,639 B1 | 9/2003 | Wang et al. |
| 6,620,670 B2 | 9/2003 | Song et al. |
| 6,620,752 B2 | 9/2003 | Messing et al. |
| 6,627,260 B2 | 9/2003 | Derderian et al. |
| 6,627,503 B2 | 9/2003 | Ma et al. |
| 6,630,383 B1 | 10/2003 | Ibok et al. |
| 6,632,279 B1 | 10/2003 | Ritala et al. |
| 6,638,810 B2 | 10/2003 | Bakli et al. |
| 6,638,859 B2 | 10/2003 | Sneh et al. |
| 6,639,267 B2 | 10/2003 | Eldridge |
| 6,641,887 B2 | 11/2003 | Lida et al. |
| 6,642,573 B1 | 11/2003 | Halliyal et al. |
| 6,645,882 B1 | 11/2003 | Halliyal et al. |
| 6,652,924 B2 | 11/2003 | Sherman |
| 6,656,764 B1 | 12/2003 | Wang et al. |
| 6,656,835 B2 | 12/2003 | Marsh et al. |
| 6,660,660 B2 | 12/2003 | Haukka et al. |
| 6,661,058 B2 | 12/2003 | Ahn et al. |
| 6,673,701 B1 | 1/2004 | Marsh et al. |
| 6,674,138 B1 | 1/2004 | Halliyal et al. |
| 6,686,212 B1 | 2/2004 | Conley, Jr. et al. |
| 6,696,332 B2 | 2/2004 | Visokay et al. |
| 6,699,747 B2 | 3/2004 | Ruff et al. |
| 6,700,132 B2 | 3/2004 | Chuman et al. |
| 6,706,115 B2 | 3/2004 | Leskela et al. |
| 6,709,989 B2 | 3/2004 | Ramdani et al. |
| 6,710,538 B1 | 3/2004 | Ahn et al. |
| 6,713,846 B1 | 3/2004 | Senzaki |
| 6,720,221 B1 | 4/2004 | Ahn et al. |
| 6,728,092 B2 | 4/2004 | Hunt et al. |
| 6,730,163 B2 | 5/2004 | Vaartstra |
| 6,730,164 B2 | 5/2004 | Vaartstra et al. |
| 6,730,575 B2 | 5/2004 | Eldridge |
| 6,734,480 B2 | 5/2004 | Chung et al. |
| 6,734,510 B2 | 5/2004 | Forbes et al. |
| 6,744,063 B2 | 6/2004 | Yoshikawa et al. |
| 6,746,930 B2 | 6/2004 | Yang et al. |
| 6,750,066 B1 | 6/2004 | Cheung et al. |
| 6,750,126 B1 | 6/2004 | Visokay et al. |
| 6,754,108 B2 | 6/2004 | Forbes |
| 6,756,298 B2 | 6/2004 | Ahn et al. |
| 6,759,151 B1 | 7/2004 | Lee |
| 6,767,582 B1 | 7/2004 | Elers |
| 6,767,795 B2 | 7/2004 | Ahn et al. |
| 6,770,536 B2 | 8/2004 | Wilk et al. |
| 6,774,050 B2 | 8/2004 | Ahn et al. |
| 6,778,441 B2 | 8/2004 | Forbes et al. |
| 6,780,704 B1 | 8/2004 | Raaijmakers et al. |
| 6,784,049 B2 | 8/2004 | Vaartstra |
| 6,784,101 B1 | 8/2004 | Yu et al. |
| 6,787,413 B2 | 9/2004 | Ahn et al. |
| 6,787,421 B2 | 9/2004 | Gilmer et al. |
| 6,787,992 B2 | 9/2004 | Chuman et al. |
| 6,790,791 B2 | 9/2004 | Ahn et al. |
| 6,794,284 B2 | 9/2004 | Vaartstra |
| 6,794,709 B2 | 9/2004 | Ahn et al. |
| 6,800,567 B2 | 10/2004 | Cho |
| 6,803,311 B2 | 10/2004 | Choi |
| 6,803,326 B2 | 10/2004 | Ahn et al. |
| 6,806,211 B2 | 10/2004 | Shinriki et al. |
| 6,812,100 B2 | 11/2004 | Ahn et al. |
| 6,821,563 B2 | 11/2004 | Yudovsky |
| 6,821,862 B2 | 11/2004 | Cho |
| 6,828,045 B1 | 12/2004 | Tokailin et al. |
| 6,831,315 B2 | 12/2004 | Raaijmakers et al. |
| 6,833,285 B1 | 12/2004 | Ahn et al. |
| 6,833,308 B2 | 12/2004 | Ahn et al. |
| 6,835,111 B2 | 12/2004 | Ahn et al. |
| 6,844,203 B2 | 1/2005 | Ahn et al. |
| 6,844,260 B2 | 1/2005 | Sarigiannis et al. |
| 6,844,604 B2 | 1/2005 | Lee et al. |
| 6,852,167 B2 | 2/2005 | Ahn |
| 6,852,645 B2 | 2/2005 | Colombo et al. |
| 6,858,120 B2 | 2/2005 | Ahn et al. |
| 6,858,444 B2 | 2/2005 | Ahn et al. |
| 6,858,865 B2 | 2/2005 | Ahn et al. |
| 6,863,725 B2 | 3/2005 | Vaartstra et al. |
| 6,884,719 B2 | 4/2005 | Chang et al. |
| 6,884,739 B2 | 4/2005 | Ahn et al. |
| 6,893,984 B2 | 5/2005 | Ahn et al. |
| 6,900,122 B2 | 5/2005 | Ahn et al. |
| 6,900,481 B2 | 5/2005 | Jin et al. |
| 6,914,800 B2 | 7/2005 | Ahn et al. |
| 6,919,266 B2 | 7/2005 | Ahn et al. |
| 6,921,702 B2 | 7/2005 | Ahn et al. |
| 6,930,059 B2 | 8/2005 | Conley, Jr. et al. |
| 6,930,346 B2 | 8/2005 | Ahn et al. |
| 6,933,225 B2 | 8/2005 | Werkhoven et al. |
| 6,949,433 B1 | 9/2005 | Hidehiko et al. |
| 6,952,032 B2 | 10/2005 | Forbes et al. |
| 6,953,730 B2 | 10/2005 | Ahn et al. |
| 6,958,300 B2 | 10/2005 | Vaartstra et al. |
| 6,958,302 B2 | 10/2005 | Ahn et al. |
| 6,958,937 B2 | 10/2005 | Forbes et al. |
| 6,960,538 B2 | 11/2005 | Ahn et al. |
| 6,963,103 B2 | 11/2005 | Forbes |
| 6,967,159 B2 | 11/2005 | Vaartstra |
| 6,979,855 B2 | 12/2005 | Ahn et al. |
| 6,982,230 B2 | 1/2006 | Cabral, Jr. et al. |
| 6,984,591 B1 | 1/2006 | Buchanan et al. |
| 6,984,592 B2 | 1/2006 | Vaartstra |
| 6,989,573 B2 | 1/2006 | Ahn et al. |
| 6,995,081 B2 | 2/2006 | Vaartstra |
| 6,995,437 B1 | 2/2006 | Kinoshita et al. |
| 7,012,297 B2 | 3/2006 | Bhattacharyya |
| 7,018,868 B1 | 3/2006 | Yang et al. |
| 7,019,351 B2 | 3/2006 | Eppich et al. |
| 7,026,694 B2 | 4/2006 | Ahn et al. |
| 7,030,042 B2 | 4/2006 | Vaartstra et al. |
| 7,041,609 B2 | 5/2006 | Vaartstra |
| 7,042,043 B2 | 5/2006 | Forbes et al. |
| 7,045,430 B2 | 5/2006 | Ahn et al. |
| 7,049,192 B2 | 5/2006 | Ahn et al. |
| 7,057,244 B2 | 6/2006 | Andreoni et al. |
| 7,064,058 B2 | 6/2006 | Ahn et al. |
| 7,068,544 B2 | 6/2006 | Forbes et al. |
| 7,071,066 B2 | 7/2006 | Wang et al. |
| 7,074,673 B2 | 7/2006 | Forbes |
| 7,075,829 B2 | 7/2006 | Forbes |
| 7,077,902 B2 | 7/2006 | Vaartstra |
| 7,081,421 B2 | 7/2006 | Ahn et al. |
| 7,084,078 B2 | 8/2006 | Ahn et al. |
| 7,087,481 B2 | 8/2006 | Vaartstra et al. |
| 7,087,954 B2 | 8/2006 | Forbes |
| 7,101,813 B2 | 9/2006 | Ahn et al. |
| 7,109,079 B2 | 9/2006 | Schaeffer, III et al. |
| 7,112,485 B2 | 9/2006 | Vaartstra |
| 7,112,841 B2 | 9/2006 | Eldridge et al. |
| 7,115,166 B2 | 10/2006 | Vaartstra et al. |
| 7,115,528 B2 | 10/2006 | Vaartstra et al. |
| 7,115,566 B2 | 10/2006 | Vaartstra et al. |
| 7,122,415 B2 | 10/2006 | Jang et al. |
| 7,122,464 B2 | 10/2006 | Vaartstra |
| 7,125,815 B2 | 10/2006 | Vaartstra |
| 7,129,553 B2 | 10/2006 | Ahn et al. |
| 7,135,421 B2 | 11/2006 | Ahn et al. |
| 7,135,734 B2 | 11/2006 | Eldridge et al. |
| 7,138,336 B2 | 11/2006 | Lee et al. |
| 7,160,577 B2 | 1/2007 | Ahn et al. |
| 7,160,817 B2 | 1/2007 | Marsh |
| 7,166,886 B2 | 1/2007 | Forbes |
| 7,169,673 B2 | 1/2007 | Ahn et al. |
| 7,183,186 B2 | 2/2007 | Ahn et al. |
| 7,187,587 B2 | 3/2007 | Forbes |
| 7,192,824 B2 | 3/2007 | Ahn et al. |
| 7,195,999 B2 | 3/2007 | Forbes et al. |
| 7,196,007 B2 | 3/2007 | Vaartstra |

| | | |
|---|---|---|
| 7,199,023 B2 | 4/2007 | Ahn et al. |
| 7,205,218 B2 | 4/2007 | Ahn et al. |
| 7,205,620 B2 | 4/2007 | Ahn et al. |
| 7,208,804 B2 | 4/2007 | Ahn et al. |
| 7,211,492 B2 | 5/2007 | Forbes et al. |
| 7,214,994 B2 | 5/2007 | Forbes et al. |
| 7,221,586 B2 | 5/2007 | Forbes et al. |
| 7,235,501 B2 | 6/2007 | Ahn et al. |
| 7,235,854 B2 | 6/2007 | Ahn et al. |
| 7,250,338 B2 | 7/2007 | Bhattacharyya |
| 7,250,367 B2 | 7/2007 | Vaartstra et al. |
| 7,253,122 B2 | 8/2007 | Vaartstra |
| 7,259,434 B2 | 8/2007 | Ahn et al. |
| 7,271,077 B2 | 9/2007 | Vaartstra et al. |
| 7,274,067 B2 | 9/2007 | Forbes |
| 7,279,413 B2 | 10/2007 | Park et al. |
| 7,294,556 B2 | 11/2007 | Vaartstra |
| 7,300,870 B2 | 11/2007 | Vaartstra |
| 7,309,664 B1 | 12/2007 | Marzolin et al. |
| 7,312,494 B2 | 12/2007 | Ahn et al. |
| 7,323,423 B2 | 1/2008 | Brask et al. |
| 7,326,980 B2 | 2/2008 | Ahn et al. |
| 7,332,442 B2 | 2/2008 | Vaartstra et al. |
| 7,365,027 B2 | 4/2008 | Ahn et al. |
| 7,368,402 B2 | 5/2008 | Vaartstra |
| 7,374,617 B2 | 5/2008 | Vaartstra |
| 7,388,246 B2 | 6/2008 | Ahn et al. |
| 7,390,756 B2 | 6/2008 | Ahn et al. |
| 7,402,876 B2 | 7/2008 | Ahn et al. |
| 7,405,454 B2 | 7/2008 | Ahn et al. |
| 7,410,668 B2 | 8/2008 | Ahn |
| 7,410,910 B2 | 8/2008 | Ahn et al. |
| 7,410,917 B2 | 8/2008 | Ahn et al. |
| 7,410,918 B2 | 8/2008 | Vaartstra |
| 7,411,237 B2 | 8/2008 | Ahn et al. |
| 7,439,194 B2 | 10/2008 | Ahn et al. |
| 7,494,939 B2 | 2/2009 | Ahn et al. |
| 7,498,230 B2 | 3/2009 | Ahn et al. |
| 7,508,025 B2 | 3/2009 | Eldridge et al. |
| 7,508,648 B2 | 3/2009 | Ahn et al. |
| 7,510,983 B2 | 3/2009 | Ahn et al. |
| 7,517,783 B2 | 4/2009 | Ahn et al. |
| 7,518,246 B2 | 4/2009 | Ahn et al. |
| 7,531,869 B2 | 5/2009 | Ahn et al. |
| 7,554,161 B2 | 6/2009 | Ahn et al. |
| 7,588,988 B2 | 9/2009 | Ahn et al. |
| 7,601,649 B2 | 10/2009 | Ahn et al. |
| 7,602,030 B2 | 10/2009 | Ahn et al. |
| 8,076,249 B2 | 12/2011 | Ahn et al. |
| 2001/0002280 A1 | 5/2001 | Sneh |
| 2001/0009695 A1 | 7/2001 | Saanila et al. |
| 2001/0012698 A1 | 8/2001 | Hayashi et al. |
| 2001/0017369 A1 | 8/2001 | Iwasaki et al. |
| 2001/0024387 A1 | 9/2001 | Raaijmakers et al. |
| 2001/0030352 A1 | 10/2001 | Ruf et al. |
| 2001/0040430 A1 | 11/2001 | Ito et al. |
| 2001/0042505 A1 | 11/2001 | Vaartstra |
| 2002/0000593 A1 | 1/2002 | Nishiyama et al. |
| 2002/0001219 A1 | 1/2002 | Forbes et al. |
| 2002/0001971 A1 | 1/2002 | Cho |
| 2002/0002216 A1 | 1/2002 | Tooley |
| 2002/0004276 A1 | 1/2002 | Ahn et al. |
| 2002/0004277 A1 | 1/2002 | Ahn et al. |
| 2002/0020429 A1 | 2/2002 | Selbrede |
| 2002/0024080 A1 | 2/2002 | Derderian et al. |
| 2002/0025628 A1 | 2/2002 | Derderian et al. |
| 2002/0028541 A1 | 3/2002 | Lee et al. |
| 2002/0046705 A1 | 4/2002 | Sandhu et al. |
| 2002/0048910 A1 | 4/2002 | Taylor et al. |
| 2002/0051859 A1 | 5/2002 | Iida et al. |
| 2002/0058578 A1 | 5/2002 | Shindo |
| 2002/0068466 A1 | 6/2002 | Lee et al. |
| 2002/0086507 A1 | 7/2002 | Park et al. |
| 2002/0086555 A1 | 7/2002 | Ahn et al. |
| 2002/0089023 A1 | 7/2002 | Yu et al. |
| 2002/0094632 A1 | 7/2002 | Agarwal et al. |
| 2002/0100418 A1 | 8/2002 | Sandhu et al. |
| 2002/0102818 A1 | 8/2002 | Sandhu et al. |
| 2002/0111001 A1 | 8/2002 | Ahn |
| 2002/0117704 A1 | 8/2002 | Gonzalez |
| 2002/0117963 A1 | 8/2002 | Chuman et al. |
| 2002/0122885 A1 | 9/2002 | Ahn |
| 2002/0125490 A1 | 9/2002 | Chuman et al. |
| 2002/0130338 A1 | 9/2002 | Ahn et al. |
| 2002/0130378 A1 | 9/2002 | Forbes et al. |
| 2002/0132374 A1 | 9/2002 | Basceri et al. |
| 2002/0135048 A1 | 9/2002 | Ahn et al. |
| 2002/0142536 A1 | 10/2002 | Zhang et al. |
| 2002/0145845 A1 | 10/2002 | Hunt et al. |
| 2002/0146916 A1 | 10/2002 | Irino et al. |
| 2002/0155688 A1 | 10/2002 | Ahn |
| 2002/0155689 A1 | 10/2002 | Ahn |
| 2002/0164420 A1 | 11/2002 | Derderian et al. |
| 2002/0167057 A1 | 11/2002 | Ahn et al. |
| 2002/0176989 A1 | 11/2002 | Knudsen et al. |
| 2002/0177244 A1 | 11/2002 | Hsu et al. |
| 2002/0190294 A1 | 12/2002 | Iizuka et al. |
| 2002/0192974 A1 | 12/2002 | Ahn et al. |
| 2002/0192975 A1 | 12/2002 | Ahn |
| 2002/0192979 A1 | 12/2002 | Ahn |
| 2002/0195056 A1 | 12/2002 | Sandhu et al. |
| 2002/0196405 A1 | 12/2002 | Colgan et al. |
| 2002/0197793 A1 | 12/2002 | Dornfest et al. |
| 2002/0197881 A1 | 12/2002 | Ramdani et al. |
| 2003/0001190 A1 | 1/2003 | Basceri et al. |
| 2003/0001241 A1 | 1/2003 | Chakrabarti et al. |
| 2003/0003635 A1 | 1/2003 | Paranjpe et al. |
| 2003/0003702 A1 | 1/2003 | Ahn |
| 2003/0003722 A1 | 1/2003 | Vaartstra |
| 2003/0017717 A1 | 1/2003 | Ahn |
| 2003/0027360 A1 | 2/2003 | Hsu et al. |
| 2003/0032270 A1 | 2/2003 | Snyder et al. |
| 2003/0042526 A1 | 3/2003 | Weimer |
| 2003/0043637 A1 | 3/2003 | Forbes et al. |
| 2003/0045082 A1 | 3/2003 | Eldridge et al. |
| 2003/0048666 A1 | 3/2003 | Eldridge et al. |
| 2003/0048745 A1 | 3/2003 | Yoshikawa et al. |
| 2003/0049942 A1 | 3/2003 | Haukka et al. |
| 2003/0052358 A1 | 3/2003 | Weimer |
| 2003/0104666 A1 | 6/2003 | Bojarczuk, Jr. et al. |
| 2003/0119313 A1 | 6/2003 | Yang et al. |
| 2003/0139039 A1 | 7/2003 | Ahn et al. |
| 2003/0141560 A1 | 7/2003 | Sun |
| 2003/0157764 A1 | 8/2003 | Ahn et al. |
| 2003/0170389 A1 | 9/2003 | Sandhu |
| 2003/0170450 A1 | 9/2003 | Stewart et al. |
| 2003/0175411 A1 | 9/2003 | Kodas et al. |
| 2003/0176065 A1 | 9/2003 | Vaartstra |
| 2003/0181039 A1 | 9/2003 | Sandhu et al. |
| 2003/0181060 A1 | 9/2003 | Asai et al. |
| 2003/0183156 A1 | 10/2003 | Dando et al. |
| 2003/0185980 A1 | 10/2003 | Endo |
| 2003/0193061 A1 | 10/2003 | Osten |
| 2003/0194861 A1 | 10/2003 | Mardian et al. |
| 2003/0194862 A1 | 10/2003 | Mardian |
| 2003/0200917 A1 | 10/2003 | Vaartstra |
| 2003/0203626 A1 | 10/2003 | Derderian et al. |
| 2003/0207032 A1 | 11/2003 | Ahn et al. |
| 2003/0207540 A1 | 11/2003 | Ahn et al. |
| 2003/0207593 A1 | 11/2003 | Derderian et al. |
| 2003/0213987 A1 | 11/2003 | Basceri |
| 2003/0222300 A1 | 12/2003 | Basceri et al. |
| 2003/0224600 A1 | 12/2003 | Cao et al. |
| 2003/0227033 A1 | 12/2003 | Ahn et al. |
| 2003/0228747 A1 | 12/2003 | Ahn et al. |
| 2003/0232511 A1 | 12/2003 | Metzner et al. |
| 2003/0235961 A1 | 12/2003 | Metzner et al. |
| 2004/0004244 A1 | 1/2004 | Ahn et al. |
| 2004/0004245 A1 | 1/2004 | Forbes et al. |
| 2004/0004247 A1 | 1/2004 | Forbes et al. |
| 2004/0004859 A1 | 1/2004 | Forbes et al. |
| 2004/0007171 A1 | 1/2004 | Ritala et al. |
| 2004/0009679 A1 | 1/2004 | Yeo et al. |
| 2004/0016944 A1 | 1/2004 | Ahn et al. |
| 2004/0023461 A1 | 2/2004 | Ahn et al. |
| 2004/0023516 A1 | 2/2004 | Londergan et al. |
| 2004/0028811 A1* | 2/2004 | Cho et al. .................. 427/248.1 |
| 2004/0033661 A1 | 2/2004 | Yeo et al. |

| | | |
|---|---|---|
| 2004/0033681 A1 | 2/2004 | Ahn et al. |
| 2004/0033701 A1 | 2/2004 | Ahn et al. |
| 2004/0036129 A1 | 2/2004 | Forbes et al. |
| 2004/0038525 A1 | 2/2004 | Meng et al. |
| 2004/0038554 A1 | 2/2004 | Ahn |
| 2004/0040494 A1 | 3/2004 | Vaartstra et al. |
| 2004/0040501 A1 | 3/2004 | Vaartstra |
| 2004/0043151 A1 | 3/2004 | Vaartstra |
| 2004/0043541 A1 | 3/2004 | Ahn et al. |
| 2004/0043600 A1 | 3/2004 | Vaartstra |
| 2004/0043604 A1 | 3/2004 | Vaartstra |
| 2004/0043625 A1 | 3/2004 | Vaartstra et al. |
| 2004/0043630 A1 | 3/2004 | Vaartstra et al. |
| 2004/0043632 A1 | 3/2004 | Vaartstra |
| 2004/0043633 A1 | 3/2004 | Vaartstra |
| 2004/0043634 A1 | 3/2004 | Vaartstra |
| 2004/0043635 A1 | 3/2004 | Vaartstra |
| 2004/0043636 A1 | 3/2004 | Vaartstra et al. |
| 2004/0065255 A1 | 4/2004 | Yang et al. |
| 2004/0066484 A1 | 4/2004 | Tokailin et al. |
| 2004/0086897 A1 | 5/2004 | Mirkin et al. |
| 2004/0094801 A1 | 5/2004 | Liang et al. |
| 2004/0110348 A1 | 6/2004 | Ahn et al. |
| 2004/0110391 A1 | 6/2004 | Ahn et al. |
| 2004/0126954 A1 | 7/2004 | Vaartstra et al. |
| 2004/0140513 A1 | 7/2004 | Forbes et al. |
| 2004/0144980 A1 | 7/2004 | Ahn et al. |
| 2004/0152254 A1 | 8/2004 | Vaartstra et al. |
| 2004/0159863 A1 | 8/2004 | Eldridge et al. |
| 2004/0164357 A1 | 8/2004 | Ahn et al. |
| 2004/0164365 A1 | 8/2004 | Ahn et al. |
| 2004/0168627 A1 | 9/2004 | Conley, Jr. et al. |
| 2004/0169453 A1 | 9/2004 | Ahn et al. |
| 2004/0171280 A1 | 9/2004 | Conley, Jr. et al. |
| 2004/0175882 A1 | 9/2004 | Ahn et al. |
| 2004/0178439 A1 | 9/2004 | Ahn et al. |
| 2004/0183108 A1 | 9/2004 | Ahn |
| 2004/0185630 A1 | 9/2004 | Forbes et al. |
| 2004/0185654 A1 | 9/2004 | Ahn |
| 2004/0187968 A1 | 9/2004 | Vaartstra |
| 2004/0189175 A1 | 9/2004 | Ahn et al. |
| 2004/0196620 A1 | 10/2004 | Knudsen et al. |
| 2004/0197946 A1 | 10/2004 | Vaartstra et al. |
| 2004/0203254 A1 | 10/2004 | Conley, Jr. et al. |
| 2004/0214399 A1 | 10/2004 | Ahn et al. |
| 2004/0217410 A1 | 11/2004 | Meng et al. |
| 2004/0219746 A1 | 11/2004 | Vaartstra et al. |
| 2004/0219783 A1 | 11/2004 | Ahn et al. |
| 2004/0222476 A1 | 11/2004 | Ahn et al. |
| 2004/0224527 A1 | 11/2004 | Sarigiannis et al. |
| 2004/0229745 A1 | 11/2004 | Miyauchi et al. |
| 2004/0235313 A1 | 11/2004 | Frank et al. |
| 2004/0248398 A1 | 12/2004 | Ahn et al. |
| 2004/0251815 A1 | 12/2004 | Tokailin et al. |
| 2004/0251841 A1 | 12/2004 | Negishi et al. |
| 2004/0262700 A1 | 12/2004 | Ahn et al. |
| 2004/0264236 A1 | 12/2004 | Chae et al. |
| 2004/0266217 A1 | 12/2004 | Kim et al. |
| 2005/0009266 A1 | 1/2005 | Vaartstra |
| 2005/0009335 A1 | 1/2005 | Dean et al. |
| 2005/0009368 A1 | 1/2005 | Vaartstra |
| 2005/0009370 A1 | 1/2005 | Ahn |
| 2005/0019978 A1 | 1/2005 | Vaartstra et al. |
| 2005/0020017 A1 | 1/2005 | Ahn et al. |
| 2005/0023574 A1 | 2/2005 | Forbes et al. |
| 2005/0023584 A1 | 2/2005 | Derderian et al. |
| 2005/0023594 A1 | 2/2005 | Ahn et al. |
| 2005/0023595 A1 | 2/2005 | Forbes et al. |
| 2005/0023602 A1 | 2/2005 | Forbes et al. |
| 2005/0023624 A1 | 2/2005 | Ahn et al. |
| 2005/0023625 A1 | 2/2005 | Ahn et al. |
| 2005/0023626 A1 | 2/2005 | Ahn et al. |
| 2005/0023627 A1 | 2/2005 | Ahn et al. |
| 2005/0026349 A1 | 2/2005 | Forbes et al. |
| 2005/0026374 A1 | 2/2005 | Ahn et al. |
| 2005/0028733 A1 | 2/2005 | Vaartstra |
| 2005/0029547 A1 | 2/2005 | Ahn et al. |
| 2005/0029604 A1 | 2/2005 | Ahn et al. |
| 2005/0029605 A1 | 2/2005 | Ahn et al. |
| 2005/0030825 A1 | 2/2005 | Ahn |
| 2005/0032292 A1 | 2/2005 | Ahn et al. |
| 2005/0032342 A1 | 2/2005 | Forbes et al. |
| 2005/0032360 A1 | 2/2005 | Vaartstra |
| 2005/0034662 A1 | 2/2005 | Ahn |
| 2005/0037563 A1 | 2/2005 | Ahn |
| 2005/0040034 A1 | 2/2005 | Landgraf et al. |
| 2005/0051824 A1 | 3/2005 | Iizuka et al. |
| 2005/0051828 A1 | 3/2005 | Park et al. |
| 2005/0054165 A1 | 3/2005 | Ahn et al. |
| 2005/0077519 A1 | 4/2005 | Ahn et al. |
| 2005/0112874 A1 | 5/2005 | Skarp et al. |
| 2005/0124109 A1 | 6/2005 | Quevado-Lopez et al. |
| 2005/0124171 A1 | 6/2005 | Vaartstra |
| 2005/0124174 A1 | 6/2005 | Ahn et al. |
| 2005/0124175 A1 | 6/2005 | Ahn et al. |
| 2005/0130442 A1 | 6/2005 | Visokay et al. |
| 2005/0136689 A9 | 6/2005 | Vaartstra |
| 2005/0138262 A1 | 6/2005 | Forbes |
| 2005/0145957 A1 | 7/2005 | Ahn et al. |
| 2005/0145959 A1 | 7/2005 | Forbes |
| 2005/0151184 A1 | 7/2005 | Lee et al. |
| 2005/0158973 A1 | 7/2005 | Ahn et al. |
| 2005/0160981 A9 | 7/2005 | Vaartstra et al. |
| 2005/0164521 A1 | 7/2005 | Ahn et al. |
| 2005/0169054 A1 | 8/2005 | Forbes |
| 2005/0173755 A1 | 8/2005 | Forbes |
| 2005/0212119 A1 | 9/2005 | Shero et al. |
| 2005/0221006 A1 | 10/2005 | Vaartstra |
| 2005/0227442 A1 | 10/2005 | Ahn et al. |
| 2005/0260357 A1 | 11/2005 | Olsen et al. |
| 2005/0277256 A1 | 12/2005 | Ahn et al. |
| 2005/0280067 A1 | 12/2005 | Ahn et al. |
| 2005/0285225 A1 | 12/2005 | Ahn et al. |
| 2005/0287804 A1 | 12/2005 | Vaaartstra |
| 2005/0287819 A1 | 12/2005 | Vaartstra et al. |
| 2006/0000412 A1 | 1/2006 | Ahn et al. |
| 2006/0001151 A1 | 1/2006 | Ahn et al. |
| 2006/0003517 A1 | 1/2006 | Ahn et al. |
| 2006/0019033 A1 | 1/2006 | Muthukrishnan et al. |
| 2006/0023513 A1 | 2/2006 | Forbes et al. |
| 2006/0024975 A1 | 2/2006 | Ahn et al. |
| 2006/0028867 A1 | 2/2006 | Forbes et al. |
| 2006/0028869 A1 | 2/2006 | Forbes et al. |
| 2006/0033165 A1 | 2/2006 | Chan et al. |
| 2006/0035405 A1 | 2/2006 | Park et al. |
| 2006/0043492 A1 | 3/2006 | Ahn et al. |
| 2006/0043504 A1 | 3/2006 | Ahn et al. |
| 2006/0046384 A1 | 3/2006 | Joo et al. |
| 2006/0046505 A1 | 3/2006 | Ahn et al. |
| 2006/0046521 A1 | 3/2006 | Vaartstra et al. |
| 2006/0046522 A1 | 3/2006 | Ahn et al. |
| 2006/0048711 A1 | 3/2006 | Vaartstra |
| 2006/0054943 A1 | 3/2006 | Li et al. |
| 2006/0128168 A1 | 6/2006 | Ahn et al. |
| 2006/0148180 A1 | 7/2006 | Ahn et al. |
| 2006/0170032 A1 | 8/2006 | Bhattacharyya |
| 2006/0172485 A1 | 8/2006 | Vaartstra |
| 2006/0176645 A1 | 8/2006 | Ahn et al. |
| 2006/0183272 A1 | 8/2006 | Ahn et al. |
| 2006/0189154 A1 | 8/2006 | Ahn et al. |
| 2006/0223337 A1 | 10/2006 | Ahn et al. |
| 2006/0228868 A1 | 10/2006 | Ahn et al. |
| 2006/0231017 A1 | 10/2006 | Vaartstra |
| 2006/0237764 A1 | 10/2006 | Ahn et al. |
| 2006/0244082 A1 | 11/2006 | Ahn et al. |
| 2006/0245984 A1 | 11/2006 | Kulkarni et al. |
| 2006/0246741 A1 | 11/2006 | Ahn et al. |
| 2006/0252211 A1 | 11/2006 | Ahn et al. |
| 2006/0252244 A1 | 11/2006 | Vaartstra et al. |
| 2006/0252279 A1 | 11/2006 | Vaartstra |
| 2006/0255470 A1 | 11/2006 | Ahn et al. |
| 2006/0257563 A1 | 11/2006 | Doh et al. |
| 2006/0258097 A1 | 11/2006 | Forbes et al. |
| 2006/0258175 A1 | 11/2006 | Vaartstra et al. |
| 2006/0261376 A1 | 11/2006 | Forbes et al. |
| 2006/0261389 A1 | 11/2006 | Vaartstra |
| 2006/0261397 A1 | 11/2006 | Ahn et al. |
| 2006/0263981 A1 | 11/2006 | Forbes |

| | | |
|---|---|---|
| 2006/0270147 A1 | 11/2006 | Ahn et al. |
| 2006/0274580 A1 | 12/2006 | Forbes |
| 2006/0281330 A1 | 12/2006 | Ahn et al. |
| 2006/0284246 A1 | 12/2006 | Forbes et al. |
| 2006/0292788 A1 | 12/2006 | Vaartstra |
| 2007/0006798 A1 | 1/2007 | Vaartstra et al. |
| 2007/0007560 A1 | 1/2007 | Forbes et al. |
| 2007/0007635 A1 | 1/2007 | Forbes et al. |
| 2007/0010060 A1 | 1/2007 | Forbes et al. |
| 2007/0010061 A1 | 1/2007 | Forbes et al. |
| 2007/0018214 A1 | 1/2007 | Ahn |
| 2007/0020835 A1 | 1/2007 | Ahn et al. |
| 2007/0037415 A1 | 2/2007 | Ahn et al. |
| 2007/0045676 A1 | 3/2007 | Forbes et al. |
| 2007/0045752 A1 | 3/2007 | Forbes et al. |
| 2007/0047319 A1 | 3/2007 | Bhattacharyya |
| 2007/0048926 A1 | 3/2007 | Ahn |
| 2007/0049023 A1 | 3/2007 | Ahn et al. |
| 2007/0049051 A1 | 3/2007 | Ahn et al. |
| 2007/0049054 A1 | 3/2007 | Ahn et al. |
| 2007/0059881 A1 | 3/2007 | Ahn et al. |
| 2007/0090439 A1 | 4/2007 | Ahn et al. |
| 2007/0090441 A1 | 4/2007 | Ahn et al. |
| 2007/0092989 A1 | 4/2007 | Kraus et al. |
| 2007/0099366 A1 | 5/2007 | Ahn et al. |
| 2007/0105313 A1 | 5/2007 | Forbes |
| 2007/0134931 A1 | 6/2007 | Ahn et al. |
| 2007/0134942 A1 | 6/2007 | Ahn et al. |
| 2007/0144438 A1 | 6/2007 | Vaartstra |
| 2007/0151861 A1 | 7/2007 | Xi et al. |
| 2007/0155190 A1 | 7/2007 | Vaartstra et al. |
| 2007/0158765 A1 | 7/2007 | Ahn et al. |
| 2007/0161260 A1 | 7/2007 | Vaartstra |
| 2007/0166999 A1 | 7/2007 | Vaartstra |
| 2007/0181931 A1 | 8/2007 | Ahn et al. |
| 2007/0187772 A1 | 8/2007 | Ahn et al. |
| 2007/0187831 A1 | 8/2007 | Ahn et al. |
| 2007/0234949 A1 | 10/2007 | Ahn et al. |
| 2007/0295273 A1 | 12/2007 | Vaartstra |
| 2008/0029790 A1 | 2/2008 | Ahn et al. |
| 2008/0032424 A1 | 2/2008 | Ahn et al. |
| 2008/0032465 A1 | 2/2008 | Ahn et al. |
| 2008/0048225 A1 | 2/2008 | Ahn et al. |
| 2008/0057659 A1 | 3/2008 | Forbes |
| 2008/0057690 A1 | 3/2008 | Forbes |
| 2008/0064210 A1 | 3/2008 | Vaartstra |
| 2008/0087890 A1 | 4/2008 | Ahn et al. |
| 2008/0102629 A1 | 5/2008 | Vaartstra |
| 2008/0121962 A1 | 5/2008 | Forbes et al. |
| 2008/0124907 A1 | 5/2008 | Forbes et al. |
| 2008/0124908 A1 | 5/2008 | Forbes et al. |
| 2008/0191350 A1 | 8/2008 | Ahn et al. |
| 2008/0191351 A1 | 8/2008 | Ahn et al. |
| 2008/0193791 A1 | 8/2008 | Ahn et al. |
| 2008/0194094 A1 | 8/2008 | Ahn et al. |
| 2008/0217676 A1 | 9/2008 | Ahn et al. |
| 2008/0274625 A1 | 11/2008 | Ahn et al. |
| 2009/0032910 A1 | 2/2009 | Ahn et al. |
| 2009/0155976 A1 | 6/2009 | Ahn et al. |

FOREIGN PATENT DOCUMENTS

| | | |
|---|---|---|
| JP | 62-199019 | 9/1987 |
| JP | 5090169 | 4/1993 |
| JP | 2001-332546 | 11/2001 |
| JP | 2002-033320 | 1/2002 |
| WO | WO-0197257 A2 | 12/2001 |
| WO | WO-0231875 A2 | 4/2002 |
| WO | WO-0243115 A2 | 5/2002 |

OTHER PUBLICATIONS

Aarik, J., et al., "Phase transformations in hafnium dioxide thin films grown by atomic layer deposition at high temperatures", Applied Surface Science, 173(1-2), (Mar. 2001), 15-21.

Aarik, Jaan, et al., "Atomic layer deposition of TiO2 thin films from TiI4 and H2O", Applied Surface Science 193, (2002), 277-286.

Aarik, Jaan, "Influence of substrate temperature on atomic layer growth and properties of HfO/sub 2/ thin films", Thin Solid Films, 340(1-2), (1999), 110-116.

Aarik, Jaan, et al., "Texture development in nanocrystalline hafnium dioxide thin films grown by atomic layer deposition", Journal of Crystal Growth, 220(1-2), (Nov. 15, 2000), 105-113.

Ahn, Kie Y, "Magnesium-Doped Zinc Oxide Structures and Methods", U.S. Appl. No. 11/706,820, filed Feb. 13, 2007 (Client ref No. 06-0979).

Ahn, Kie Y, et al., "Methods to Form Dielectric Structures in Semiconductor Devices and Resulting Devices", U.S. Appl. No. 11/581,675, filed Aug. 16, 2006.

Ahn, Kie Y, "Molybdenum-Doped Indium Oxide Structures and Methods", U.S. Appl. No. 11/706,944, filed Feb. 13, 2007.

Ahn, Kie Y., et al., "Tungsten-Doped Indium Oxide Structures and Methods", U.S. Appl. No. 11/706,498, filed Feb. 13, 2007 (Client ref No. 06-06-0912).

Ahn, Kie Y., et al., "Zirconium-Doped Zinc Oxide Structures and Methods", U.S. Appl. No. 11/707,173, filed Feb. 13, 2007 (Client ref No. 06-0853).

Alers, G. B., et al., "Intermixing at the tantalum oxide/silicon interface in gate dielectric structures", Applied Physics Letters, 73(11), (Sep. 14, 1998), 1517-1519.

Atanassova, E., et al., "Breakdown Fields and Conduction Mechanisms in thin Ta2O5 Layers on Si for high density DRAMs", Microelectronics Reliability, 42, (2002), 157-173.

Brassard, D., et al., "High-k titanium silicate thin films grown by reactive magnetron sputtering for complementary metal?oxide?semiconductor applications", J. Vac. Sci. Technol. A, 22(3), (May 2004), 851-855.

Bright, A A, et al., "Low-rate plasma oxidation of Si in a dilute oxygen/helium plasma for low-temperature gate quality Si/Sio2 interfaces", Applied Physics Letters, 58(6), (Feb. 1991), 619-621.

Bunshah, Rointan F, et al., "Deposition Technologies for Films and Coatings: Developments and Applications", Park Ridge, N.J., U.S.A. : Noyes Publications, (1982), 102-103.

Chambers, J J, et al., "Physical and electrical characterization of ultrathin yttrium silicate insulators on silicon", Journal of Applied Physics, 90(2), (Jul. 15, 2001), 918-33.

Chen, F., "A study of mixtures of HfO2 and TiO2 as high-k gate dielectrics", Microelectronic Engineering 72, (2004), 263.

Chen, F., et al., "Hafnium Titanate as a High-K Gate Insulator", Electrochemical Society Proceedings, vol. 2004-01, (2004), 278-285.

Cheng, Baohong, et al., "The Impact of High-k Gate Dielectrics and Metal Gate Electrodes on Sub-100nm MOSFET's", IEEE Transactions on Electron Devices, 46(7), (Jul. 1999), 1537-1544.

Chin, A., et al., "High Quality La2O3 and Al2O3 Gate Dielectrics with Equivalent Oxide Thickness 5-10A", Digest of Technical Papers. 2000 Symposium on VLSI Technology, 2000, Honolulu, (Jun. 13-15, 2000), 16-17.

Clark-Phelps, R. B, et al., "Engineered Tantalum Aluminate and Hafnium Aluminate ALD Films for Ultrathin Dielectric Films with Improved Electric and Thermal Properties", Gate Stack and Silicide Issues in Silicon Processing II. Symposium (Materials Research Society Symposium Proceedings vol. 670), (Apr. 17, 2001), pp. K2201-K2206.

Colombo, D., et al., "Anhydrous Metal Nitrates as Volatile Single Source Precursors for the CVD of Metal Oxide Films", Communications, Department of EE, U of M, Mpls, MN, (Jul. 7, 1998), 3 pages.

Conley, J. F, "Atomic Layer Deposition of Hafnium Oxide Using Anhydrous Hafnium Nitrate", Electrochemical and Solid-State Letters, 5(5), (May 2002), C57-C59.

Copel, M., et al., "Structure and stability of ultrathin zirconium oxide layers on Si(001)", Applied Physics Letters, 76(4), (Jan. 2000), 436-438.

Desu, S B, "Minimization of Fatigue in Ferroelectric Films", Physica Status Solidi A, 151(2), (1995), 467-480.

Domagala, R. F., et al., "The Pseudobinary Ti—ZrO2", J. Am. Ceramic Soc., vol. 56, Paper first presented in 1970, (1973), 584-587.

Dover, V., et al., "Deposition of Uniform Zr—Sn—Ti—O Films by On-Axis Reactive Sputtering", IEEE Electron Device Letters, vol. 19, No. 9, (Sep. 1998), 329-331.

Duenas, et al., "Interface Quality of High-Pressure Reactive Sputterd and Atomic Layer Deposited Titanium oxide Thin Films on Silicon", IEEE Transaction, Spanish Conference on Electronic Devices, (Feb. 2-4, 2005), 49-52.

Eisentraut, K. J., "Volatile Rare Earth Chelates", J. Am. Chem. Soc. 87:22, (Nov. 20, 1965), 5254-5256.

Engelhardt, M., "Modern Applications of Plasma Etching and Patterning in Silicon Process Technology", Contributions to Plasma Physics, 39(5), (1999), 473-478.

Forbes, "Hafnium Tantalum Oxynitride High-K Dielectric and Metal Gates", U.S. Appl. No. 11/515,114, filed Aug. 31, 2005.

Forbes, et al., "Tantalum Aluminum Oxynitride High-K Dielectric and Metal Gates", U.S. Appl. No. 11/514,655, filed Aug. 31, 2006.

Forbes, Leonard, "Memory Utilizing Oxide-Conductor Nanolaminates", U.S. Appl. No. 11/496,196, filed Jul. 31, 2006, 58 pgs.

Forsgren, Katarina, "Atomic Layer Deposition of HfO2 using hafnium iodide", Conference held in Monterey, California, (May 2001), 1 page.

Fuyuki, Takashi, et al., "Electronic Properties of the Interface between Si and TiO2 Deposited at Very Low Temperatures", Japanese Journal of Applied Physics, Part 1 (Regular Papers & Short Notes), 25(9), (Sep. 1986), 1288-1291.

Fuyuki, Takashi, et al., "Initial stage of ultra-thin SiO/sub 2/ formation at low temperatures using activated oxygen", Applied Surface Science, 117-118, (Jun. 1997), 123-126.

Gartner, M., et al., "Spectroellipsometric characterization of lanthanide-doped TiO/sub 2/ films obtained via the sol-gel technique", Thin Solid Films, 234(1-2), (1993), 561-565.

Geller, S., et al., "Crystallographic Studies of Perovskite-like Compounds. II. Rare Earth Aluminates", Acta Cryst., 9, (May 1956), 1019-1025.

Giess, E. A., et al., "Lanthanide gallate perovskite-type substrates for epitaxial, high-T/sub c/ superconducting Ba/sub 2/YCu/sub 3/O/sub 7-delta / films", IBM Journal of Research and Development, 34(6), (Nov. 1990), 916-926.

Guo, Xin, et al., "High quality ultra-thin (1.5 nm) TiO2—Si3N4 gate dielectric for deep sub-micron CMOS technology", IEDM Technical Digest. International Electron Devices Meeting, (Dec. 5-8, 1999), 137-140.

Herman, Marian, "Atomic layer epitaxy—12 years later", Vacuum, vol. 42, No. 1-2, (1991), 61-66.

Hirayama, Masaki, et al., "Low-Temperature Growth of High-Integrity Silicon Oxide Films by Oxygen Radical Generated in High Density Krypton Plasma", International Electron Devices Meeting 1999. Technical Digest, (1999), 249-252.

Hubbard, K. J., et al., "Thermodynamic stability of binary oxides in contact with silicon", Journal of Materials Research, 11(11), (Nov. 1996), 2757-2776.

Hunt, C. E., et al., "Direct bonding of micromachined silicon wafers for laser diode heat exchanger applications", Journal of Micromechanics and Microengineering, 1(3), (Sep. 1991), 152-156.

Iddles, D M, et al., "Relationships between dopants, microstructure and the microwave dielectric properties of ZrO2—TiO2—SnO2 ceramics", Journal of Materials Science, 27(23), (Dec. 1992), 6303-6310.

Jeong, Chang-Wook, et al., "Plasma-Assisted Atomic layer Growth of High-Quality Aluminum Oxide Thin Films", Japanese Journal of Applied Physics, 40, (Jan. 2001), 285-289.

Jones, A. J, et al., "Some recent developments in the MOCVD and ALD of high k dielectric oxides", J. of Materials Chemistry, par. 3.2, (Sep. 2004), 3109.

Kamada, Takeshi, et al., "Structure and Properties of Silicon Titanium Oxide Films Prepared by Plasma-Enhanced Chemical Vapor Deposition Method", Japanese Journal of Applied Physics, vol. 30, No. 12B, (Dec. 1991), 3594-3596.

Kawai, Y, et al., "Ultra-low-temperature growth of high-integrity gate oxide films by low-energy Ion-assisted oxidation", Applied Physics Letters, 64(17), (Apr. 1994), 2223-2225.

Keomany, D., et al., "Sol gel preparation of mixed cerium-titanium oxide thin films", Solar Energy Materials and Solar Cells, 33(4), (Aug. 1994), 429-441.

Kim, Byoung-Youp, et al., "Comparison study for TiN films deposited from different method: chemical vapor deposition and atomic layer deposition", Mechanisms of Surface and Microstructure Evolution in Deposited Films and Film Structures Symposium (Materials Research Society Symposium Proceedings vol. 672), (2001), 7.8.1-7.8.6.

Kim, C. T., "Application of Al2O3 Grown by Atomic Layer Deposition to DRAM and FeRAM", 12th International Symposium in Integrated Ferroelectrics, (Mar. 2000), p. 316.

Kim, C. T, et al., "Application of Al2O3 Grown by Atomic Layer Deposition to DRAM and FeRAM", International Symposium in Integrated Ferroelectrics, (Mar. 2000), 316.

Kim, D., et al., "Atomic Control of Substrate Termination and Heteroepitaxial Growth of SrTiO3/LaAlO3 Films", Journal of the Korean Physical Society, 36(6), (Jun. 2000), 444-448.

Kim, Y, et al., "Substrate dependence on the optical properties of Al2O3 films grown by atomic layer deposition", Applied Physics Letters, 71(25), (Dec. 22, 1997), 3604-3606.

Kim, Y., et al., "Substrate dependence on the optical properties of Al/sub 2/O/sub 3/ films grown by atomic layer deposition", Applied Physics Letters, 71(25 ), (Dec. 22, 1997), 3604-3606.

Kingon, Angus I, et al., "review article Alternative dielectrics to silicon dioxide for memory and logic devices", Nature, 406, (Aug. 31, 2000), 1032-1038.

Krauter, G., et al., "Room Temperature Silicon Wafer Bonding with Ultra-Thin Polymer Films", Advanced Materials, 9(5), (1997), 417-420.

Kukli, K., et al., "Controlled growth of yttrium oxysulphide thin films by atomic layer deposition", Materials Science Forum, 315-317, (1999), 216-221.

Kukli, Kaupo, "Atomic Layer Deposition of Titanium Oxide from TiI4 and H2O2", Chemical Vapor Deposition, 6(6), (2000), 303-310.

Kukli, Kaupo, "Comparison of hafnium oxide films grown by atomic layer deposition from iodide and chloride precursors", Thin Solid Films, 416, (2002), 72-79.

Kukli, Kaupo, et al., "Dielectric Properties of Zirconium Oxide Grown by Atomic Layer Deposition from Iodide Precursor", Journal of the Electrochemical Society, 148(12), (2001), F227-F232.

Kukli, Kaupo, "Low-Temperature Deposition of Zirconium Oxide-Based Nanocrystalline Films by Alternate Supply of Zr[OC(CH3)3]4 and H2O", Chemical Vapor Deposition, 6(6), (2000), 297-302.

Kukli, Kaupo, "Tailoring the dielectric properties of HfO2—Ta2O3 nanolaminates", Appl. Phys. Lett., 68, (1996), 3737-3739.

Kwo, J., "Properties of high k gate dielectrics Gd2O3 and Y2O3 for Si", Journal of Applied Physics, 89(7), (2001), 3920-3927.

Lee, A E, et al., "Epitaxially grown sputtered LaAlO3 films", Applied Physics Letters, 57(19), (Nov. 1990), 2019-2021.

Lee, Byoung Hun, et al., "Ultrathin Hafnium Oxide with Low Leakage and Excellent Reliability for Alternative Gate Dielectric Application", Technical Digest of IEDM, (1999), 133-136.

Lee, C H, et al., "MOS Devices with High Quality Ultra Thin CVD ZrO2 Gate Dielectrics and Self-Aligned TaN and TaN/Poly-Si Gate electrodes", 2001 Symposium on VLSI, Technology Digest of Technical Papers, (2001), 137-138.

Lee, C. H., "MOS Characteristics of Ultra Thin Rapid Thermal CVD ZrO2 and Zr Silicate Gate Dielectrics", Electron Devices Meeting, 2000. IEDM Technical Digest. International, (2000), 27-30.

Lee, C., et al., "Self-Assembly of Metal Nanocrystals on Ultrathin Oxide for Nonvolatile Memory Applications", J. Elect. Mater; vol. 34(1), (Jan. 2005), 1-11.

Lee, Cheng-Chung, et al., "Ion-assisted deposition of silver thin films", Thin Solid Films, 359, (2000), pp. 95-97.

Lee, Dong Heon, et al., "Metalorganic chemical vapor deposition of TiO/sub 2/:N anatase thin film on Si substrate", Applied Physics Letters, 66(7), (Feb. 1995), 815-816.

Lee, L P, et al., "Monolithic 77 K dc SQUID magnetometer", Applied Physics Letters, 59(23), (Dec. 1991), 3051-3053.

Lee, Young H., et al., "Plasma enhanced chemical vapor deposition of TiO2 in microwave-radio frequency hybrid plasma reactor", J. Vac. Sci. Technol. A 13(3), (May/Jun. 1995), 596-601.

Leskela, M, "ALD precursor chemistry: Evolution and future challenges", Journal de Physique IV (Proceedings), 9(8), (Sep. 1999), 837-852.

Leskela, M., "ALD precursor chemistry: Evolution and future challenges", J. Phys. IV France, 9, (1999), 837-852.

Liu, C. T., "Circuit Requirement and Integration Challenges of Thin Gate Dielectrics for Ultra Small MOSFETs", International Electron Devices Meeting 1998. Technical Digest, (1998), 747-750.

Liu, Y C, et al., "Growth of ultrathin SiO/sub 2/ on Si by surface irradiation with an O/sub 2/+Ar electron cyclotron resonance microwave plasma at low temperatures", Journal of Applied Physics, 85(3), (Feb. 1999), 1911-1915.

Liu, Z., et al., "Metal Nanocrystal Memories—Part I: Device Design and Fabrication", IEEE Trans. Elect. Dev; vol. 49(9), (Sep. 2002), 1606-1613.

Lu, Xu-Bing, et al., "Structure and dielectric prioperties of amorphous LaAlO3 and LaAlOxNy films as alternative gate dielectric materials", Journal of Applied Physics, 94(2), (Jul. 15, 2003), 1229-1234.

Lucovsky, G, et al., "Microscopic model for enhanced dielectric constants in low concentration SiO/sub 2/-rich noncrystalline Zr and Hf silicate alloys", Applied Physics Letters, 77(18), (Oct. 2000), 2912-2914.

Luo, Z J, et al., "Ultra-thin ZrO2 (or Silicate) with High Thermal Stability for CMOS Gate Applications", 2001 Symposium on VLSI Technology Digest of Technical Papers, (2001), 135-136.

Martin, P J, et al., "Ion-beam-assisted deposition of thin films", Applied Optics, 22(1), (Jan. 1983), 178-184.

Molodyk, A A, et al., "Volatile Surfactant-Assisted MOCVD: Application to LaAlO3 Thin Film Growth", Chemical Vapor Deposition, 6(3), (Jun. 2000), 133-138.

Molsa, Heinz, et al., "Growth of yttrium oxide thin films from beta-diketonate precursor", Advanced Materials for Optics and Electronics, 4(6), (Nov.-Dec. 1994), 389-400.

Morais, J., et al., "Composition, atomic transport and chemical stability of ZrAlxOy ultrathin films deposited on Si(001)", Applied Physics letter, vol. 79(13), (2001), 1998.

Morais, J., et al., "Composition, atomic transport, and chemical stability of ZrAlxOy ultrathin films deposited on Si(001)", Applied Physics Letters, 79(13), (Sep. 24, 2001), 1998-2000.

Muller, D. A., et al., "The electronic structure at the atomic scale of ultrathin gate oxides", Nature, 399, (Jun. 24, 1999), 758-61.

Nabatame, T., et al., "Design and Proof of high quality HfAlO/sub x/film formation for MOSCAPs and nMOSFETs through Layer-by-Layer Deposition and Annealing process", VLSI Technology, 2003. Digest of Technical Papers. 2003 Symposium, (Jun. 10-12, 2003), 25-26.

Nakagawara, Osamu, et al., "Electrical properties of (Zr, Sn)TiO4 dielectric thin film prepared by pulsed laser deposition", Journal of Applied Physics, 80(1), (Jul. 1996), 388-392.

Nakajima, Anri, et al., "NH/sub 3/-annealed atomic-layer-deposited silicon nitride as a high-k gate dielectric with high reliability", Applied Physics Letters, 80(7), (Feb. 2002), 1252-1254.

Nalwa, H. S, "Handbook of Thin Film Materials", Deposition and Processing of Thin Films, vol. 1, San Diego : Academic Press, (2002), 114-119.

Neumayer, D A, et al., "Materials characterization of ZrO/sub 2/-SiO/sub 2/ and HfO/sub 2/-SiO/sub 2/ binary oxides deposited by chemical solution deposition", Journal of Applied Physics, 90(4), (Aug. 15, 2001), 1801-1808.

Nieminen, Minna, et al., "Atomic layer epitaxy growth of LaGaO3 thin films", J. Mater Chem., vol. 11, (Nov. 2001), 3148-3153.

Nieminen, Minna, et al., "Formation and stability of lanthanum oxide thin films deposited from B-diketonate precursor", Applied Surface Science, 174(2), (Apr. 16, 2001), 155-165.

Nieminen, Minna, et al., "Growth of gallium oxide thin films from gallium acetylacetonate by atomic layer deposition", J. Mater. Chem., 6(1), (1996), 27-31.

Niilisk, A, "Atomic-scale optical monitoring of the initial growth of TiO2 thin films", Proceedings of the SPIE—The International Society for Optical Engineering, 4318, (2001), 72-77.

Ohmi, S., et al., "Rare Earth Metal Oxides for High-K Gate Insulator", Electrochemical Society Proceedings, vol. 2002-2, (2002), 376-387.

Ohring, Milton, "The Materials Science of Thin Films", Boston : Academic Press, (1992), 118,121,125.

Osten, H. J., et al., "High-k gate dielectrics with ultra-low leakage current based on praseodymium oxide", International Electron Devices Meeting 2000. Technical Digest. IEDM, (2000), 653-656.

Paivasaari, Jani, et al., "A comparative study on lanthanide oxide thin films grown by atomic layer deposition", Thin Solid Films, 472(1-2), First available online in 2004, Aug. 13, 2004), 275-281.

Pan, Tung Ming, et al., "High quality ultrathin CoTiO/sub 3/ high-k gate dielectrics", Electrochemical and Solid-State Letters, 3(9), (Sep. 2000), 433-434.

Pan, Tung Ming, et al., "High-k cobalt-titanium oxide dielectrics formed by oxidation of sputtered Co/Ti or Ti/Co films", Applied Physics Letters, 78(10), (Mar. 5, 2001), 1439-1441.

Park, Byung-Eun, et al., "Electrical properties of LaAlO3/Si and Sr0.8Bi2.2Ta2O9/LaAlO3/Si structures", Applied Physics Letters, 79(6), (Aug. 2001), 806-808.

Park, Jaehoo, et al., "Chemical vapor deposition of HfO/sub 2/ thin films using a novel carbon-free precursor: characterization of the interface with the silicon substrate", Journal of the Electrochemical Society, 149(1), (2002), G89-G94.

Qi, Wen-Jie, et al., "MOSCAP and MOSFET characteristics using ZrO2 gate dielectric deposited directly on Si", Electron Devices Meeting, 1999. IEDM Technical Digest. International, (1999), 145-148.

Qi, Wen-Jie, et al., "Performance of MOSFETs with ultra thin ZrO/sub 2/ and Zr silicate gate dielectrics", 2000 Symposium on VLSI Technology. Digest of Technical Papers, (2000), 40-41.

Rahtu, Antti, "Atomic Layer Deposition of Zirconium Titanium Oxide from Titanium Isopropoxide and Zirconium Chloride", Chemistry of Materials, 13(5), (May 2001), 1528-1532.

Ramakrishnan, E S, et al., "Dielectric properties of radio frequency magnetron sputter deposited zirconium titanate-based thin films", Journal of the Electrochemical Society, 145(1), (Jan. 1998), 358-362.

Rayner Jr., G, et al., "The structure of plasma-deposited and annealed pseudo-binary ZrO2—SiO2 alloys", Materials Research Society Symposium—Proceedings, 611, (2000), C131-C139.

Reidy, S., et al., "Comparison of two surface preparations used in the homoepitaxial growth of silicon films by plasma enhanced chemical vapor deposition", J. Vac. Sci. Technol. B 21(3), (May/June), 970-974.

Rhee, H. S, et al., "Cobalt Metallorganic Chemical Vapor Deposition and Formation of Epitaxial CoSI2 Layer on Si(100) Substrate", Journal of Electrochemical Society, 146(6), (1999), 2720-2724.

Ritala, M, et al., "Atomic layer Deposition of Oxide Thin Films with Metal Alkoxides as Oxygen Sources", Science 288(5464), (Apr. 14, 2000), 319-321.

Ritala, Mikko, "Atomic Layer Epitaxy Growth of Titanium, Zirconium and Hafnium Dioxide Thin Films", Annales Academiae Scientiarum Fennicae, (1994), 24-25.

Ritala, Mikko, "Zirconium dioxide thin films deposited by ALE using zirconium tetrachloride as precursor", Applied Surface Science, 75, (Jan. 1994), 333-340.

Robertson, J., "Band offsets of wide-band-gap oxides and implications for future electronic devices", Journal of Vacuum Science & Technology B (Microelectronics and Nanometer Structures), 18(3), (May-Jun. 2000), 1785-1791.

Robertson, John, "Band offsets of wide-band-gap oxides and implications for future electronic devices", Journal of Vacuum Science & Technology B: Microelectronics and Nanometer Structures, 18(3), (May 2000), 1785-1791.

Rotondaro, A L, et al., "Advanced CMOS Transistors with a Novel HfSiON Gate Dielectric", Symposium on VLSI Technology Digest of Technical Papers, (2002), 148-149.

Ruh, Robert, et al., "Phase Relations and Thermal Expansion in the System HfO2—TiO2", J. Am. Ceramic Soc., 59, (Nov.-Dec. 1976), 495-499.

Saito, Yuji, et al., "Advantage of Radical Oxidation for Improving Reliability of Ultra-Thin Gate Oxide", 2000 Symposium on VLSI Technology Digest of Technical Papers, (2000), 176-177.

Saito, Yuji, et al., "High-Integrity Silicon Oxide Grown at Low-Temperature by Atomic Oxygen Generated in High-Density Krypton Plasma", Extended Abstracts of the 1999 International Conference on Solid State Devices and Materials, (1999), 152-153.

Sarkar, D. K., et al., "High-k titanium silicate dielectric thin films grown by pulsed-laser deposition", Applied Physics Letters, vol. 80, No. 2, (Jan. 14, 2002), 294-296.

Shanware, A, et al., "Reliability evaluation of HfSiON gate dielectric film with 12.8 A SiO2 equivalent thickness", International Electron Devices Meeting. Technical Digest, (2001), 6.6.1-6.6.4.

Shin, Chang Ho, et al., "Fabrication and Characterization of MFISFET using Al2O3 Insulating Layer for Non-Volatile Memory", 12th International Symposium in Integrated Ferroelectrics, (Mar. 2000), 1-9.

Shin, Chang Ho, "Fabrication and Characterization of MFISFET Using Al2O3 Insulating Layer for Non-volatile Memory", 12th International Symposium in Integrated Ferroelectrics, (Mar. 2000), 9 pages.

Smith, Ryan C., "Chemical Vapour Deposition of the Oxides of Titanium, Zirconium and Hafnium for Use as High-k Materials in Microelectronic Devices. A Carbon-free Precursor for the Synthesis of Hafnium Dioxide", Advanced Materials for Optics and Electronics, 10(3-5), (2000), 105-114.

Smith, Ryan C., et al., "CVD of TixSi1-xO2 Films: Precursor Chemistry Impacts Film Composition", Chemical Vapor Deposition vol. 9, No. 2, (2003), 79-86.

Sneh, Ofer, "Thin film atomic layer deposition equipment for semiconductor processing", Thin Solid Films, 402(1-2), Preparation and Characterization, Elsevier Sequoia, NL, vol. 402, No. 1-2, (2002), 248-261.

Somorjai, "Introduction to surface chemistry and catalysis", (1994), 336-337.

Song, Hyun-Jung, et al., "Atomic Layer Deposition of Ta2O5 Films Using Ta(OC2H5)5 and NH3", Ultrathin SiO/sub 2/ and High-K Materials for ULSI Gate Dielectrics. Symposium, (1999), 469-471.

Sun, S. C., et al., "Effects of Electrode Materials and annealing Ambients on the Electrical Properties of TiO2 Thin Films by Metalorganic Chemical Vapor Deposition", Jpn. J. Appl. Phys. vol. 36, (Mar. 1997), 1346-1350.

Suntola, T., "Atomic Layer Epitaxy", Handbook of Crystal Growth, 3; Thin Films of Epitaxy, Part B: Growth Mechanics and Dynamics, Amsterdam, (1994), 601-663.

Suntola, Tuomo, "Atomic layer epitaxy", Thin Solid Films, 216(1), (Aug. 28, 1992), 84-89.

Sze, S M, "Physics of Semiconductor Devices", New York : Wiley, (1981), 431.

Sze, S M, "Physics of Semiconductor Devices", New York : Wiley, (1981), 473.

Takemoto, J. H., et al., "Microstrip Resonators and Filters Using High-TC Superconducting Thin Films on LaAlO3", IEEE Transaction on Magnetics, 27(2), (Mar. 1991), 2549-2552.

Tarre, A, et al., "Comparative study of low-temperature chloride atomic-layer chemical vapor deposition of TiO2 and SnO2", Applied Surface Science, 175-176, (May 2001), 111-116.

Van Dover, R B, "Amorphous lanthanide-doped TiOx dielectric films", Applied Physics Letters, 74(20), (May 1999), 3041-3043.

Van Dover, R. B., "Discovery of a useful thin-film dielectric using a composition-spread approach", Nature, 392, (Mar. 12, 1998), 162-164.

Van Dover, Robert B., et al., "Deposition of Uniform Zr—Sn—Ti—O films by ON-Axis Reactive Sputtering", IEEE Electron Device Letters, 19(9), (Sep. 1998), 329-331.

Viirola, H, et al., "Controlled growth of antimony-doped tin dioxide thin films by atomic layer epitaxy", Thin Solid Films, 251, (Nov. 1994), 127-135.

Viirola, H, et al., "Controlled growth of tin dioxide thin films by atomic layer epitaxy", Thin Solid Films, 249(2), (Sep. 1994), 144-149.

Visokay, M R, "Application of HfSiON as a gate dielectric material", Applied Physics Letters, 80(17), (Apr. 2002), 3183-3185.

Wilk, G D, et al., "Hafnium and zirconium silicates for advanced gate dielectrics", Journal of Applied Physics, 87(1), (Jan. 2000), 484-492.

Wilk, G. D., "High-K gate dielectrics: Current status and materials properties considerations", Journal of Applied Physics, 89(10), (May 2001), 5243-5275.

Wolf, Stanley, et al., "Future Trends in Sputter Deposition Processes", In: Silicon Processing of the VLSI Era, vol. 1, Lattice Press, (1986), 374-380.

Wolf, Stanley, et al., "Silicon Processing for the VLSI Era—vol. I: Process Technology", Second Edition, lattice Press, Sunset Beach, California, (2000), 443.

Xiao, et al., "Deposition of hard mental nitride-like coatings in an electro cyclotron resonance discharge", Elsevier, (Sep. 13, 2003), 389-393.

Yamaguchi, Takeshi, et al., "Band Diagram and Carrier Conduction Mechanism in ZrO2/Zr-silicate/Si MIS Structure Fabricated by Pulsed-laser-ablation Deposition", Electron Devices Meeting, 2000. IEDM Technical Digest. International, (2000), 19-22.

Yan, J., "Structural and electrical characterization of TiO/sub 2/ grown from titanium tetrakis-isopropoxide (TTIP) and TTIP/H/sub 2/O ambients", Journal of Vacuum Science & Technology B (Microelectronics and Nanometer Structures), 14(3), (May-Jun. 1996), 1706-1711.

Yu, Xiongfei, et al., "High Mobility and Excellent Electrical Stability of MOSFETs Using a Novel HfTaO Gate Dielectric", 2004 Symposium on VLSI Technology Digest of Technical Papers, (Jun. 15-17, 2004), 110-111.

Zhang, H, et al., "High permitivity thin film nanolaminates", Journal of Applied Physics, 87(4), (Feb. 2000), 1921-1924.

Zhang, H., "Atomic Layer Deposition of High Dielectric Constant Nanolaminates", Journal of the Electrochemical Society, 148(4), (Apr. 2001), F63-F66.

Zhu, W, et al., "HfO2 and HfAlO for CMOS: Thermal Stability and Current Transport", IEEE International Electron Device Meeting 2001, (2001), 463-466.

Zucker, O, et al., "Application of Oxygen Plasma Processing to Silicon Direct Bonding", Sensors and Actuators A, 36, (1993), 227-231.

* cited by examiner

METHODS OF FORMING TITANIUM SILICON OXIDE

RELATED APPLICATION

This application is a continuation of U.S. application Ser. No. 12/730,951, filed Mar. 24, 2010, now issued as U.S. Pat. No. 8,076,249 which is a continuation of U.S. application Ser. No. 11/093,104, filed Mar. 29, 2005, now issued as U.S. Pat. No. 7,687,409, both of which are incorporated herein by reference in their entirety.

TECHNICAL FIELD

This application relates generally to semiconductor devices and device fabrication.

BACKGROUND

The semiconductor device industry has a market driven need to reduce the size of devices such as transistors. To reduce transistor size, the thickness of the silicon dioxide, $SiO_2$, gate dielectric is reduced in proportion to the shrinkage of the gate length. For example, a metal-oxide-semiconductor field effect transistor (MOSFET) would use a 1.5 nm thick $SiO_2$ gate dielectric for a gate length of 70 nm. A goal is to fabricate increasingly smaller and more reliable integrated circuits (ICs) for use in products such as processor chips, mobile telephones, and memory devices such as dynamic random access memories (DRAMs).

Currently, the semiconductor industry relies on the ability to reduce or scale the dimensions of its basic devices, primarily, the silicon based MOSFET. This device scaling includes scaling the gate dielectric, which has primarily been fabricated using silicon dioxide. A thermally grown amorphous $SiO_2$ layer provides an electrically and thermodynamically stable material, where the interface of the $SiO_2$ layer with underlying silicon provides a high quality interface as well as superior electrical isolation properties. However, increased scaling and other requirements in microelectronic devices have created the need to use other dielectric materials as gate dielectrics.

DETAILED DESCRIPTION

Figure 1:
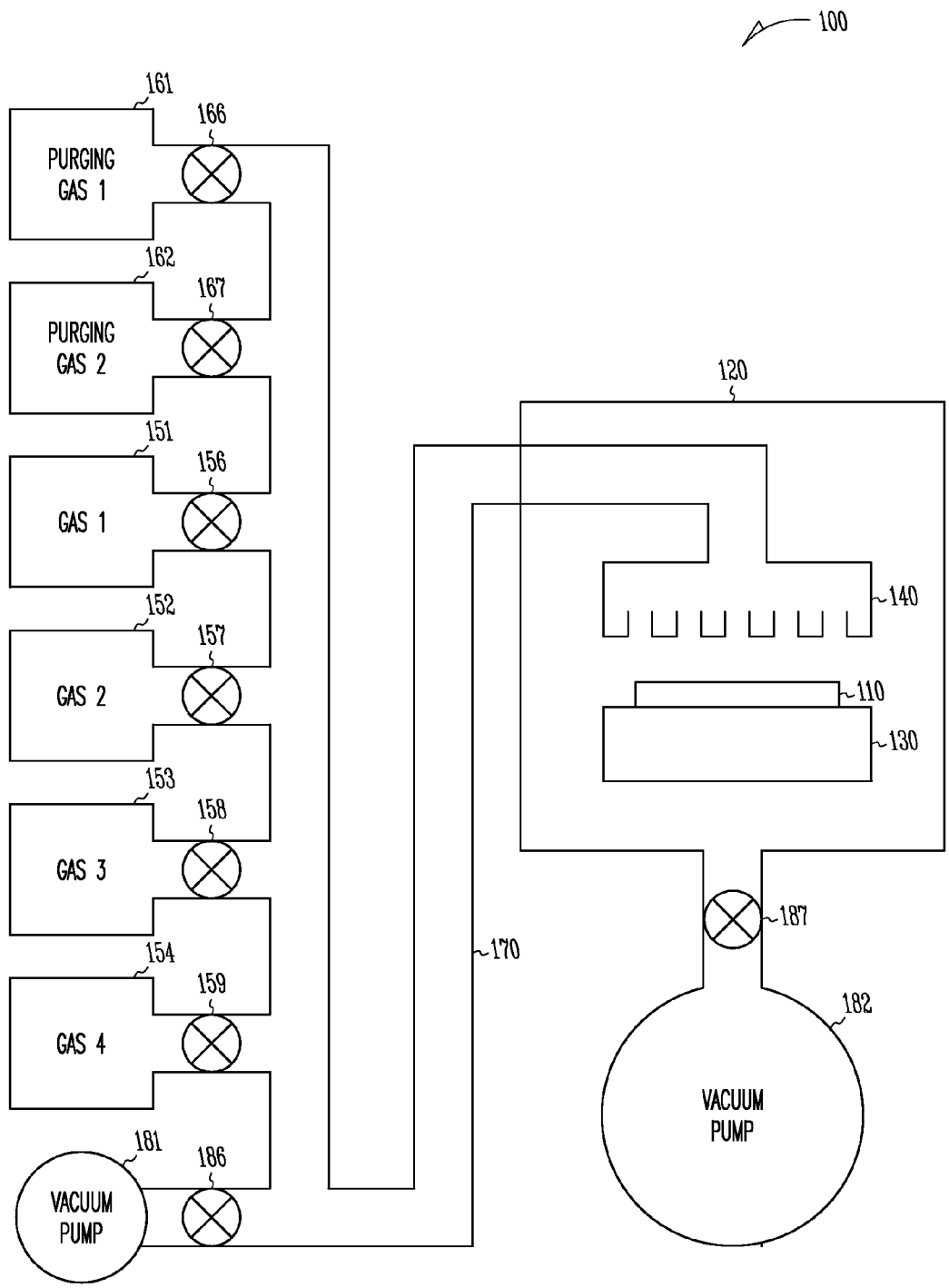
FIG. 1 depicts an atomic layer deposition system for an embodiment of a method for fabricating a dielectric layer containing titanium silicon oxide.

The following detailed description refers to the accompanying drawings that show, by way of illustration, specific aspects and embodiments in which the present invention may be practiced. These embodiments are described in sufficient detail to enable those skilled in the art to practice the present invention. Other embodiments may be utilized and structural, logical, and electrical changes may be made without departing from the scope of the present invention. The various embodiments disclosed herein are not necessarily mutually exclusive, as some disclosed embodiments can be combined with one or more other disclosed embodiments to form new embodiments.

The terms wafer and substrate used in the following description include any structure having an exposed surface with which to form an integrated circuit (IC) structure. The term substrate is understood to include semiconductor wafers. The term substrate is also used to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures well known to one skilled in the art. The term conductor is understood to generally include n-type and p-type semiconductors and the term insulator or dielectric is defined to include any material that is less electrically conductive than the materials referred to as conductors. The following detailed description is, therefore, not to be taken in a limiting sense, and the scope of the present invention is defined only by the appended claims, along with the full scope of equivalents to which such claims are entitled.

In an embodiment, an electronic device includes a dielectric layer containing a titanium silicon oxide film in an integrated circuit, where the titanium silicon oxide film has a regulated oxygen content. In various embodiments, methods for forming electronic devices and systems include forming a dielectric layer containing a titanium silicon oxide film in an integrated circuit, where the titanium silicon oxide film is formed by atomic layer deposition. The atomic layer deposited titanium silicon oxide layer may be formed having a predetermined oxygen content by regulating the precursors used to incorporate oxygen in the titanium silicon oxide. Regulation of the oxygen content in the titanium silicon oxide films may control oxygen vacancies in the atomic layer deposited film. Controlling oxygen vacancies in a titanium silicon oxide film may provide for a film that has a relatively high dielectric constant and low leakage current characteristics. In an embodiment, titanium-containing precursors and silicon-containing precursors that are substantially without oxygen content are used in the atomic layer deposition process. These precursors may include titanium halide precursors and silicon halide precursors. Oxygen content in atomic layer deposition processes using titanium and silicon precursors that are substantially without oxygen content may be provided by oxygen in reactant precursors used in the process.

A gate dielectric in a transistor has both a physical gate dielectric thickness and an equivalent oxide thickness ($t_{eq}$). The equivalent oxide thickness quantifies the electrical properties, such as capacitance, of the gate dielectric in terms of a representative physical thickness. $t_{eq}$ is defined as the thickness of a theoretical $SiO_2$ layer that would be required to have the same capacitance density as a given dielectric, ignoring leakage current and reliability considerations.

A $SiO_2$ layer of thickness, t, deposited on a Si surface as a gate dielectric will have a $t_{eq}$ larger than its thickness, t. This $t_{eq}$ results from the capacitance in the surface channel on which the $SiO_2$ is deposited due to the formation of a depletion/inversion region. This depletion/inversion region can result in $t_{eq}$ being from 3 to 6 Angstroms (Å) larger than the $SiO_2$ thickness, t. Thus, with the semiconductor industry driving to someday scale the gate dielectric equivalent oxide thickness to under 10 Å, the physical thickness for a $SiO_2$ layer used for a gate dielectric would be need to be approximately 4 to 7 Å.

Additional requirements on a $SiO_2$ layer would depend on the gate electrode used in conjunction with the $SiO_2$ gate dielectric. Using a conventional polysilicon gate would result in an additional increase in $t_{eq}$ for the $SiO_2$ layer. This additional thickness could be eliminated by using a metal gate electrode. Maintaining the use of a conventional polysilicon gate, future devices would be designed towards a physical $SiO_2$ gate dielectric layer of about 5 Å or less. Such a small thickness for a $SiO_2$ oxide layer creates additional problems.

Silicon dioxide is used as a gate dielectric, in part, due to its electrical isolation properties in a $SiO_2$—Si based structure. This electrical isolation is due to the relatively large band gap of $SiO_2$ (8.9 eV) making it a good insulator from electrical conduction. Significant reductions in its band gap would eliminate it as a material for a gate dielectric. As the thickness of a $SiO_2$ layer decreases, the number of atomic layers, or monolayers of the material in the thickness decreases. At a certain thickness, the number of monolayers will be sufficiently small that the $SiO_2$ layer will not have a complete arrangement of atoms as in a larger or bulk layer. As a result of incomplete formation relative to a bulk structure, a thin $SiO_2$ layer of only one or two monolayers will not form a full band gap. The lack of a full band gap in a $SiO_2$ gate dielectric would cause an effective short between an underlying Si channel and an overlying polysilicon gate. This undesirable property sets a limit on the physical thickness to which a $SiO_2$ layer can be scaled. The minimum thickness due to this monolayer effect is thought to be about 7-8 Å. Therefore, for future devices to have a $t_{eq}$ less than about 10 Å, other dielectrics than $SiO_2$ need to be considered for use as a gate dielectric.

For a typical dielectric layer used as a gate dielectric, the capacitance is determined as one for a parallel plate capacitance: $C=\kappa\epsilon_0 A/t$, where $\kappa$ is the dielectric constant, $\epsilon_0$ is the permittivity of free space, A is the area of the capacitor, and t is the thickness of the dielectric. The thickness, t, of a material is related to its $t_{eq}$ for a given capacitance, with $SiO_2$ having a dielectric constant $\kappa_{ox}=3.9$, as $$t=(\kappa/\kappa_{ox})t_{eq}=(\kappa/3.9)t_{eq}.$$

Thus, materials with a dielectric constant greater than that of $SiO_2$, 3.9, will have a physical thickness that can be considerably larger than a desired $t_{eq}$, while providing the desired equivalent oxide thickness. For example, an alternate dielectric material with a dielectric constant of 10 could have a thickness of about 25.6 Å to provide a $t_{eq}$ of 10 Å, not including any depletion/inversion layer effects. Thus, a reduced equivalent oxide thickness for transistors can be realized by using dielectric materials with higher dielectric constants than $SiO_2$.

The thinner equivalent oxide thickness required for lower transistor operating voltages and smaller transistor dimensions may be realized by a significant number of materials, but additional fabricating requirements makes determining a suitable replacement for $SiO_2$ difficult. The current view for the microelectronics industry is still for Si based devices. This requires that the gate dielectric employed be grown on a silicon substrate or silicon layer, which places significant constraints on the substitute dielectric material. During the formation of the dielectric on the silicon layer, there exists the possibility that a small layer of $SiO_2$ could be formed in addition to the desired dielectric. The result would effectively be a dielectric layer consisting of two sublayers in parallel with each other and the silicon layer on which the dielectric is formed. In such a case, the resulting capacitance would be that of two dielectrics in series. As a result, the $t_{eq}$ of the dielectric layer would be the sum of the $SiO_2$ thickness and a multiplicative factor of the thickness, t, of the dielectric being formed, written as $$t_{eq}=t_{SiO_2}+(\kappa_{ox}/\kappa)t.$$

Thus, if a $SiO_2$ layer is formed in the process, the $t_{eq}$ is again limited by a $SiO_2$ layer. In the event that a barrier layer is formed between the silicon layer and the desired dielectric in which the barrier layer prevents the formation of a $SiO_2$ layer, the $t_{eq}$ would be limited by the layer with the lowest dielectric constant. However, whether a single dielectric layer with a high dielectric constant or a barrier layer with a higher dielectric constant than $SiO_2$ is employed, the layer interfacing with the silicon layer must provide a high quality interface to maintain a high channel carrier mobility.

One of the advantages of using $SiO_2$ as a gate dielectric has been that the formation of the $SiO_2$ layer results in an amorphous gate dielectric. Having an amorphous structure for a gate dielectric provides for reducing problems of leakage current associated with grain boundaries in polycrystalline gate dielectrics that provide high leakage paths. Additionally, grain size and orientation changes throughout a polycrystalline gate dielectric can cause variations in the film's dielectric constant, along with uniformity and surface topography problems. Typically, materials having the advantage of a high dielectric constant relative to $SiO_2$ also have the disadvantage of a crystalline form, at least in a bulk configuration. The best candidates for replacing $SiO_2$ as a gate dielectric are those that can be fabricated as a thin layer with an amorphous form and that have a high dielectric constant.

High-κ materials include materials having a dielectric constant greater than silicon dioxide, for example, dielectric materials having a dielectric constant greater than about twice the dielectric constant of silicon dioxide. Examples of such high-κ materials include $HfO_2$, $ZrO_2$, $Ta_2O_3$, $La_2O_3$, $Al_2O_3$, and $Y_2O_3$. Other materials that provide dielectric constants higher than silicon oxide include metal silicates, though the dielectric constants of metal silicates tend to be lower than their corresponding metal oxides. Dielectric layers of titanium silicon oxide offer a material that can provide a relatively high dielectric constant with respect to silicon oxide. Engineering a titanium silicon oxide film can provide dielectric layers for electronic devices with dielectric constants that may range in value from about 3.9 for $SiO_2$ to about 80 for $TiO_2$.

Other characteristics for choosing a silicon oxide replacement include using materials that provide a sharp interface with silicon that may lead to a low density of interface states, that provide a large energy barrier from the conduction band to the Fermi level of the gate electrode to maintain leakage current at acceptable levels, and that provide structural stability with contact electrodes and substrate material during device processing steps performed after providing the dielectric layer.

Various embodiments for forming a titanium silicon oxide film by atomic layer deposition provide a film having a titanium silicate, a titanium oxide/silicon oxide mixture, or a combination of a titanium silicate and a titanium oxide/silicon oxide mixture. Furthermore, the titanium silicon oxide film may be a specific stoichiometric titanium silicon oxide and/or a non-stoichiometric titanium silicon oxide. The expression $TiSi_xO_y$ is used herein to represent a stoichiometric and/or a non-stoichiometric titanium silicate, the expression $TiO_x$ is used herein to represent a stoichiometric and/or a non-stoichiometric titanium oxide, and the expression $SiO_y$ is used herein to represent a stoichiometric and/or a non-stoichiometric silicon oxide. A silicon oxide, a titanium oxide, or a titanium silicate may contain trace amounts or dopants of other elements. Embodiments of dielectric layers containing an atomic layer deposited titanium silicon oxide layer have a larger dielectric constant than silicon dioxide. Such dielectric layers provide a significantly thinner equivalent oxide thickness compared with a silicon oxide layer having the same physical thickness. Alternatively, such dielectric layers provide a significantly thicker physical thickness than a silicon oxide layer having the same equivalent oxide thickness. This increased physical thickness aids in reducing leakage current.

Another consideration for selecting the material and method for forming a dielectric layer for use in electronic devices and systems concerns the roughness of a dielectric layer on a substrate. Surface roughness of the dielectric layer has a significant effect on the electrical properties of the gate oxide, and the resulting operating characteristics of the transistor. The leakage current through a physical 1.0 nm gate oxide increases by a factor of 10 for every 0.1 increase in the root-mean-square (RMS) roughness.

During a conventional sputtering deposition process stage, particles of the material to be deposited bombard the surface at a high energy. When a particle hits the surface, some particles adhere, and other particles cause damage. High energy impacts remove body region particles creating pits. The surface of such a deposited layer can have a rough contour due to the rough interface at the body region.

In an embodiment, a titanium silicon oxide dielectric layer having a substantially smooth surface relative to other processing techniques is formed using atomic layer deposition (ALD). Further, forming such a dielectric layer using atomic layer deposition can provide for controlling transitions between material layers. Thus, atomic layer deposited titanium silicon oxide dielectric layers can have an engineered transition with a substrate surface.

ALD, also known as atomic layer epitaxy (ALE), is a modification of chemical vapor deposition (CVD) and is also called "alternatively pulsed-CVD." In ALD, gaseous precursors are introduced one at a time to the substrate surface mounted within a reaction chamber (or reactor). This introduction of the gaseous precursors takes the form of pulses of each gaseous precursor. In a pulse of a precursor gas, the precursor gas is made to flow into a specific area or region for a short period of time. Between the pulses, the reaction chamber is purged with a gas, which in many cases is an inert gas, and/or evacuated.

In a chemisorption-saturated ALD (CS-ALD) process, during the first pulsing phase, reaction with the substrate occurs with the precursor saturatively chemisorbed at the substrate surface. Subsequent pulsing with a purging gas removes precursor excess from the reaction chamber.

The second pulsing phase introduces another precursor on the substrate where the growth reaction of the desired film takes place. Subsequent to the film growth reaction, reaction byproducts and precursor excess are purged from the reaction chamber. With favourable precursor chemistry where the precursors adsorb and react with each other on the substrate aggressively, one ALD cycle can be performed in less than one second in properly designed flow type reaction chambers. Typically, precursor pulse times range from about 0.5 sec to about 2 to 3 seconds.

In ALD, the saturation of all the reaction and purging phases makes the growth self-limiting. This self-limiting growth results in large area uniformity and conformality, which has important applications for such cases as planar substrates, deep trenches, and in the processing of porous silicon and high surface area silica and alumina powders. Significantly, ALD provides for controlling film thickness in a straightforward manner by controlling the number of growth cycles.

The precursors used in an ALD process may be gaseous, liquid or solid. However, liquid or solid precursors should be volatile. The vapor pressure should be high enough for effective mass transportation. Also, solid and some liquid precursors may need to be heated inside the reaction chamber and introduced through heated tubes to the substrates. The necessary vapor pressure should be reached at a temperature below the substrate temperature to avoid the condensation of the precursors on the substrate. Due to the self-limiting growth mechanisms of ALD, relatively low vapor pressure solid precursors can be used, though evaporation rates may vary somewhat during the process because of changes in their surface area.

There are several other characteristics for precursors used in ALD. The precursors should be thermally stable at the substrate temperature, because their decomposition would destroy the surface control and accordingly the advantages of the ALD method that relies on the reaction of the precursor at the substrate surface. A slight decomposition, if slow compared to the ALD growth, may be tolerated.

The precursors should chemisorb on or react with the surface, though the interaction between the precursor and the surface as well as the mechanism for the adsorption is different for different precursors. The molecules at the substrate surface should react aggressively with the second precursor to form the desired solid film. Additionally, precursors should not react with the film to cause etching, and precursors should not dissolve in the film. Using highly reactive precursors in ALD contrasts with the selection of precursors for conventional CVD.

The by-products in the reaction should be gaseous in order to allow their easy removal from the reaction chamber. Further, the by-products should not react or adsorb on the surface.

In a reaction sequence ALD (RS-ALD) process, the self-limiting process sequence involves sequential surface chemical reactions. RS-ALD relies on chemistry between a reactive surface and a reactive molecular precursor. In an RS-ALD process, molecular precursors are pulsed into the ALD reaction chamber separately. The metal precursor reaction at the substrate is typically followed by an inert gas pulse to remove excess precursor and by-products from the reaction chamber prior to pulsing the next precursor of the fabrication sequence.

By RS-ALD, films can be layered in equal metered sequences that are all identical in chemical kinetics, deposition per cycle, composition, and thickness. RS-ALD sequences generally deposit less than a full layer per cycle. Typically, a deposition or growth rate of about 0.25 to about 2.00 Å per RS-ALD cycle can be realized.

The advantages of RS-ALD include continuity at an interface avoiding poorly defined nucleating regions that are typical for chemical vapor deposition (<20 Å) and physical vapor deposition (<50 Å), conformality over a variety of substrate topologies due to its layer-by-layer deposition technique, use of low temperature and mildly oxidizing processes, lack of dependence on the reaction chamber, growth thickness dependent solely on the number of cycles performed, and ability to engineer multilayer laminate films with resolution of one to two monolayers. RS-ALD processes allows for deposition control on the order on monolayers and the ability to deposit monolayers of amorphous films.

Herein, a sequence refers to the ALD material formation based on an ALD reaction of a precursor with its reactant precursor. For example, forming titanium oxide from a $TiI_4$ precursor and $H_2O_2$, as its reactant precursor, forms an embodiment of a titanium/oxygen sequence, which can also be referred to as a titanium sequence. In various ALD processes that form an oxide or a compound that contains oxygen, a reactant precursor that contains oxygen is used to supply oxygen. Herein, a precursor that contains oxygen and that supplies oxygen to be incorporated in the ALD compound formed and is typically used in an ALD process with precursors supplying the other elements in the ALD compound is referred to as an oxygen reactant precursor. In the above example, $H_2O_2$ is an oxygen reactant precursor. A cycle of a sequence includes pulsing a precursor, pulsing a purging gas for the precursor, pulsing a reactant precursor, and pulsing the reactant's purging gas. Further, in forming a layer of a metal species, an ALD sequence may deal with reacting a precursor containing the metal species with a substrate surface. A cycle for such a metal forming sequence may include pulsing a purging gas after pulsing the precursor containing the metal species. Additionally, deposition of a semiconductor material may be realized in a manner similar to forming a layer of a metal, given the appropriate precursors for the semiconductor material.

In an ALD formation of a compound having more than two elements, a cycle includes a number of sequences to provide the elements of the compound. For example, a cycle for an ALD formation of an $ABO_x$ compound may include sequentially pulsing a first precursor/a purging gas for the first precursor/a first reactant precursor/the first reactant's purging gas/a second precursor/a purging gas for the second precursor/a second reactant precursor/the second reactant's purging gas, which may be viewed as a cycle having two sequences. There may be cases in which ALD formation of an $ABO_x$ compound uses one precursor that contains the elements A and B such that pulsing the AB containing precursor followed by its reactant precursor onto a substrate includes a reaction that deposits $ABO_x$ on the substrate to provide an AB/oxygen sequence. A cycle of an AB/oxygen sequence may include pulsing a precursor containing A and B, pulsing a purging gas for the precursor, pulsing a reactant precursor to the A/B precursor, and pulsing a purging gas for the reactant precursor. A cycle may be repeated a number of times to provide a desired thickness of the compound. In an embodiment, a layer of titanium silicon oxide is formed on a substrate mounted in a reaction chamber using ALD in repetitive titanium and silicon sequences using precursor gases individually pulsed into the reaction chamber. Alternatively, solid or liquid precursors can be used in an appropriately designed reaction chamber.

FIG. 1 shows an embodiment of an atomic layer deposition system 100 for processing a dielectric layer containing a titanium silicon oxide film. In FIG. 1, a substrate 110 is located inside a reaction chamber 120 of ALD system 100. Also located within the reaction chamber 120 is a heating element 130, which is thermally coupled to substrate 110 to control the substrate temperature. A gas-distribution fixture 140 introduces precursor gases to the substrate 110. Each precursor gas originates from individual gas sources 151-154 whose flow is controlled by mass-flow controllers 156-159, respectively. Gas sources 151-154 provide a precursor gas either by storing the precursor as a gas or by providing a location and apparatus for evaporating a solid or liquid material to form the selected precursor gas.

Also included in the ALD system are purging gas sources 161, 162, each of which is coupled to mass-flow controllers 166, 167, respectively. Furthermore, additional purging gas sources can be constructed in ALD system 100, one purging gas source for each precursor gas, for example. For a process that uses the same purging gas for multiple precursor gases, fewer purging gas sources are required for ALD system 100. Gas sources 151-154 and purging gas sources 161-162 are coupled by their associated mass-flow controllers to a common gas line or conduit 170, which is coupled to the gas-distribution fixture 140 inside the reaction chamber 120. Gas conduit 170 is also coupled to vacuum pump, or exhaust pump, 181 by mass-flow controller 186 to remove excess precursor gases, purging gases, and by-product gases from the gas conduit at the end of a purging sequence.

Vacuum pump, or exhaust pump, 182 is coupled by mass-flow controller 187 to remove excess precursor gases, purging gases, and by-product gases from reaction chamber 120 at the end of a purging sequence. For convenience, control displays, mounting apparatus, temperature sensing devices, substrate maneuvering apparatus, and necessary electrical connections as are known to those skilled in the art are not shown in FIG. 1. Though ALD system 100 is well suited for practicing the present invention, other ALD systems, commercially available, may be used.

The use, construction and fundamental operation of reaction chambers for deposition of films are understood by those of ordinary skill in the art of semiconductor fabrication. Embodiments of the present invention may be practiced on a variety of such reaction chambers without undue experimentation. Furthermore, one of ordinary skill in the art will comprehend the necessary detection, measurement, and control techniques in the art of semiconductor fabrication upon reading the disclosure.

The elements of ALD system 100 can be controlled by a computer. To focus on the use of ALD system 100 in the various embodiments of the present invention, the computer is not shown. Those skilled in the art can appreciate that the individual elements such as pressure control, temperature control, and gas flow within ALD system 100 can be under computer control.

In an embodiment, a method for forming an electronic apparatus includes forming a dielectric layer containing a titanium silicon oxide film in an integrated circuit, where the titanium silicon oxide film is formed by atomic layer deposition. The titanium silicon oxide film may be a $TiO_x/SiO_y$ mixture film, a $TiSi_xO_y$ film, or a film having a combination of a $TiO_x/SiO_y$ mixture and $TiSi_xO_y$. In an embodiment, the dielectric layer is formed substantially as the titanium silicon oxide film. In an embodiment, the titanium silicon oxide film is formed with a predetermined amount of silicon with respect to the total amount of silicon and titanium in the titanium silicon oxide film. In an embodiment, the titanium silicon oxide film is formed with the oxygen content of the film regulated. In various embodiments, the dielectric layer may be formed as a dielectric in a capacitor in an integrated circuit, as a dielectric in a capacitor of a dynamic random access memory, as a gate insulator in a silicon complementary metal oxide semiconductor transistor, as a tunnel gate insulator in a flash memory device, as an inter-gate insulator in a flash memory device, as a dielectric in a NROM flash memory, and as a nanolaminate dielectric in a NROM flash memory. An embodiment of a dielectric layer containing a titanium silicon oxide film may be formed as an integral part of a wide variety of electronic devices in electronic apparatus and systems.

Figure 2:
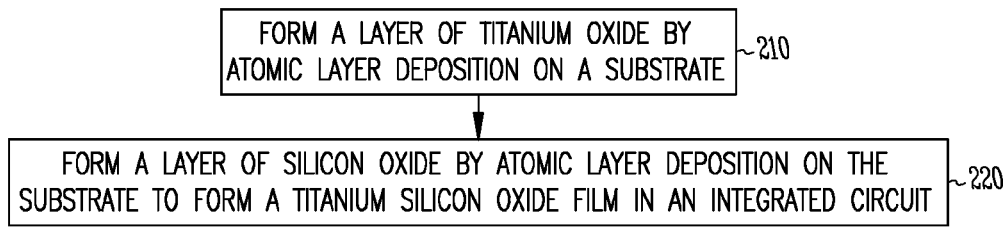
FIG. 2 illustrates a flow diagram of elements for an embodiment of a method to form a dielectric layer containing a titanium silicon oxide film by atomic layer deposition.

FIG. 2 illustrates a flow diagram of elements for an embodiment of a method to form a dielectric layer containing a titanium silicon oxide film. At 210, a layer of titanium oxide is formed on a substrate by atomic layer deposition. The layer may be formed to provide uniform coverage of the desired area of the substrate surface for forming the dielectric layer. A number of precursors containing titanium may be used to provide titanium and a number of precursors containing oxygen may be used. At 220, a layer of silicon oxide is formed on the substrate by atomic layer deposition. A number of precursors containing silicon may be used to provide silicon and a number of precursors containing oxygen may be used. The silicon oxide and the titanium oxide are deposited to form a titanium silicon oxide film. The titanium silicon oxide film may be formed as an integral component of an electronic device in an integrated circuit.

In an embodiment, titanium oxide is deposited before silicon oxide. In an embodiment, silicon oxide is deposited before titanium oxide. Alternatively, titanium and silicon may be jointly deposited using precursors that substantially do not react with each other, but react at the substrate surface. In an embodiment, one of either titanium or silicon may be deposited by atomic layer deposition with the other metal deposited at a later stage of the process for forming the titanium silicon oxide film.

In an embodiment, a titanium halide precursor is pulsed onto a substrate, a silicon halide precursor is pulsed onto the substrate, and, after pulsing both the titanium halide and silicon halide precursors, an oxygen reactant precursor is pulsed onto the substrate to form a titanium silicon oxide film by atomic layer deposition in an integrated circuit. In such an embodiment, an oxygen reactant precursor is pulsed only after at least one titanium halide precursor and one silicon halide precursor has been pulsed. The titanium halide and silicon halide precursors may be $TiCl_4$ and $SiCl_4$. The titanium silicon oxide film may be formed as a $TiO_x/SiO_y$ mixture, a $TiSi_xO_y$, or a combination of a $TiO_x/SiO_y$ mixture and $TiSi_xO_y$.

In various embodiments, an atomic layer deposited titanium silicon oxide layer having a predetermined oxygen content may be formed by regulating the precursors used to incorporate oxygen in the titanium silicon oxide. Regulation of the oxygen content in the titanium silicon oxide films may control the formation or the distribution of oxygen vacancies in the atomic layer deposited film. Oxygen content regulation may be provided through control of the pulsing sequence, pulse time of the oxygen containing precursors, and coverage of the film region with respect to forming a substantially complete layer or partial layer during a cycle, along with regulating the substrate environment such as the temperature. Providing the regulation of the oxygen content may include the selection of the precursors to be used in the ALD process. Selection of appropriate oxygen reactant precursors in a sequence using an organometallic titanium precursor and/or a silicon precursor containing oxygen may affect the overall oxygen content of the ALD titanium silicon oxide film. Controlling oxygen vacancies in a titanium silicon oxide film may provide a film that has a relatively high dielectric constant and low leakage current characteristics. In an embodiment, titanium-containing precursors and silicon-containing precursors that are substantially without oxygen content are used in the atomic layer deposition process. These precursors may include titanium halide precursors and silicon halide precursors. Oxygen content in atomic layer deposition processes using titanium and silicon precursors that are substantially without oxygen content may be provided by oxygen in reactant precursors used in the process.

In an embodiment, a silicon precursor, whose structure may be represented by SiR, may be used in an ALD process with a TiR precursor to form a film of titanium silicon oxide, where R represents a compound such that SiR and TiR may be used as an ALD precursor. In an embodiment, R is a halide. In an embodiment, $TiCl_4$ and $SiCl_4$ may be used to form an atomic layer deposited titanium silicon oxide layer. Alternatively, $TiI_4$ and $SiI_4$ may be used as precursors. Using non-organometallic precursors may limit the incorporation of carbon in a film of atomic layer deposited titanium silicon oxide. In an embodiment, a method may include forming a titanium silicon oxide layer by atomic layer deposition, where the layer is substantially without carbon content.

A titanium silicon oxide layer may be formed using a number of cycles having various permutations of titanium sequences and silicon sequences. In an embodiment, the titanium sequences and the silicon sequences are controlled to form the titanium silicon oxide film with a predetermined amount of silicon with respect to the total amount of silicon and titanium in the titanium silicon oxide film. By controlling the content of the silicon and the titanium in the titanium silicon oxide film, a film may be engineered with predetermined electrical characteristics. With a high silicon content relative to titanium, the dielectric constant of the film approaches that of silicon oxide with a low leakage current density at a given electric field strength. With a low silicon content relative to titanium, the dielectric constant of the film approaches that of titanium oxide, but with a higher leakage current density at the same electric field strength. The silicon content may be adjusted to provide a titanium silicon oxide film having a dielectric constant in the 20 range, while maintaining an acceptable range of leakage current density. In an embodiment, for a given ratio of silicon to titanium (or amount of silicon with respect to the total amount of silicon and titanium), an ALD process for forming a titanium silicon oxide film may include regulating the oxygen content in the titanium silicon oxide to control the formation or distribution of vacancies in the titanium silicon oxide film. This oxygen content regulation may enhance the leakage current characteristics of the titanium silicon oxide film.

Either before or after forming the titanium silicon film, other dielectric layers such as nitride layers and/or insulating metal oxide layers may be formed as part of the dielectric layer. The dielectric layer may be formed as a nanolaminate. An embodiment of a nanolaminate may include a layer of titanium oxide and the titanium silicon oxide film. Alternatively, the dielectric layer may be formed substantially as the titanium silicon oxide film.

In various embodiments, the structure of the interface between the dielectric layer and the substrate on which it is disposed is controlled to limit the inclusion of silicon oxide, since a silicon oxide layer would reduce the effective dielectric constant of the dielectric layer. The material composition and properties for an interface layer are typically dependent on process conditions and the condition of the substrate before forming the dielectric layer. Though the existence of an interface layer may effectively reduce the dielectric constant associated with the dielectric layer and its substrate, the interface layer, such as a silicon oxide interface layer or other composition interface layer, may improve the interface density, fixed charge density, and channel mobility of a device having this interface layer.

In the various embodiments, the thickness of a titanium silicon oxide film is related to the number of ALD cycles performed and the growth rate associated with the selected permutations of sequences in the cycles. As can be understood by those skilled in the art, particular effective growth rates for the engineered titanium silicon oxide film can be determined during normal initial testing of the ALD system for processing a titanium silicon oxide dielectric for a given application without undue experimentation.

Atomic layer deposition of the individual components of the titanium silicon oxide layer allows for individual control of each precursor pulsed into the reaction chamber. Thus, each precursor is pulsed into the reaction chamber for a predetermined period, where the predetermined period can be set separately for each precursor. Additionally, for various embodiments for ALD formation of a titanium silicon oxide layer, each precursor can be pulsed into the reaction under separate environmental conditions. The substrate can be maintained at a selected temperature and the reaction chamber maintained at a selected pressure independently for pulsing each precursor. Appropriate temperatures and pressures may be maintained, whether the precursor is a single precursor or a mixture of precursors. During atomic layer deposition, the pulsing of the precursor gases is separated by purging the reaction chamber with a purging gas following each pulsing of a precursor. In an embodiment, nitrogen gas is used as the purging gas following the pulsing of each precursor used in a cycle to form a film of titanium silicon oxide. Additionally, the reaction chamber can also be purged by evacuating the reaction chamber.

Figure 3:
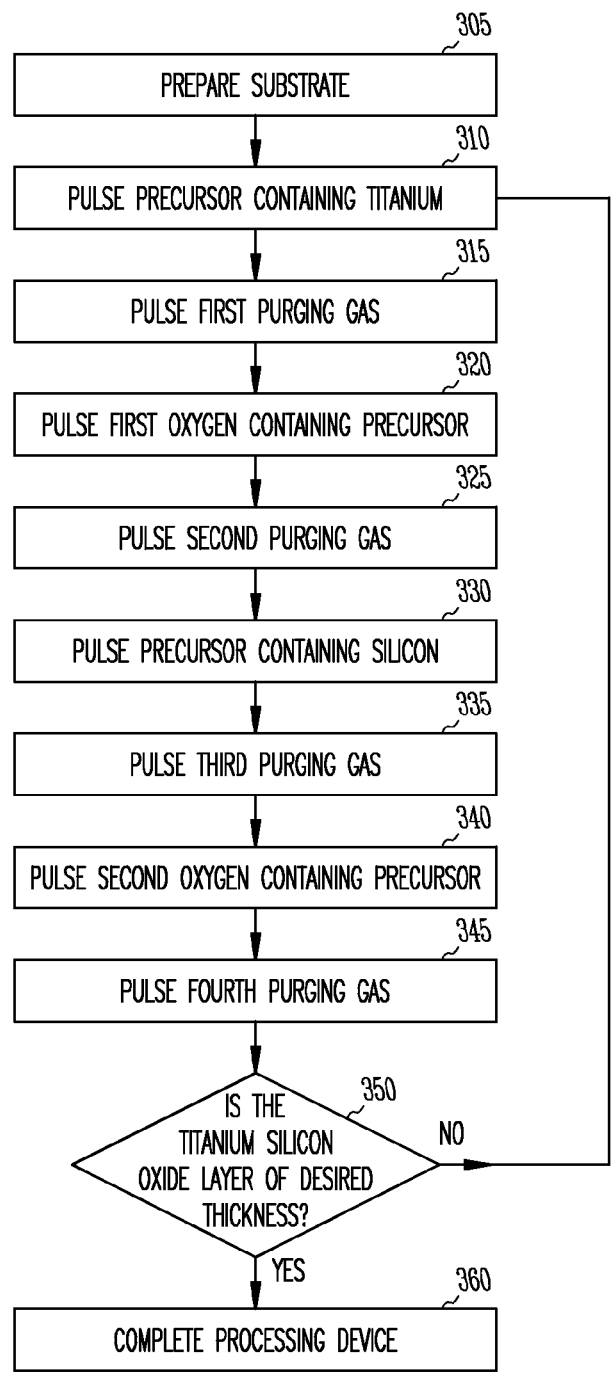
FIG. 3 illustrates a flow diagram of elements for an embodiment of a method to form a dielectric layer containing a titanium silicon oxide film by atomic layer deposition.

FIG. 3 illustrates a flow diagram of elements for an embodiment of a method to form a dielectric layer containing an atomic layer deposited titanium silicon oxide layer. This embodiment can be implemented with the atomic layer deposition system 100 of FIG. 1. At 305, a substrate 110 is prepared. The substrate used for forming a transistor is typically a silicon or silicon containing material. In other embodiments, germanium, gallium arsenide, silicon-on-sapphire substrates, or other suitable substrates may be used. This preparation process may include cleaning substrate 110 and forming layers and regions of the substrate, such as drains and sources of a metal oxide semiconductor (MOS) transistor, prior to forming a gate dielectric. Alternatively, these active regions may be formed after forming the dielectric layer, depending on the over-all fabrication process implemented. In an embodiment, the substrate is cleaned to provide an initial substrate depleted of its native oxide. In an embodiment, the initial substrate is cleaned also to provide a hydrogen-terminated surface. In an embodiment, a silicon substrate undergoes a final hydrofluoric (HF) rinse prior to ALD processing to provide the silicon substrate with a hydrogen-terminated surface without a native silicon oxide layer.

Cleaning immediately preceding atomic layer deposition aids in reducing an occurrence of silicon oxide as an interface between a silicon based substrate and a titanium silicon oxide dielectric formed using the atomic layer deposition process. The material composition and properties of an interface layer are typically dependent on process conditions and the condition of the substrate before forming the dielectric layer. Though the existence of an interface layer may effectively reduce the dielectric constant associated with the dielectric layer and its substrate, the interface layer, such as a $SiO_2$ interface layer or other composition interface layer, may improve the interface density, fixed charge density, and channel mobility of a device having this interface layer.

The sequencing of the formation of the regions of the transistor being processed may follow typical sequencing that is generally performed in the fabrication of a MOS transistor as is well known to those skilled in the art. Prior to forming a gate dielectric, masking of substrate regions to be protected during the gate dielectric formation, as is typically performed in MOS fabrication, may be included in the processing. In this embodiment, the unmasked region includes a body region of a transistor; however, one skilled in the art will recognize that other semiconductor device structures may utilize this process. Additionally, the substrate 110 in its ready-for-processing form is conveyed into a position in reaction chamber 120 for ALD processing.

At 310, a precursor containing titanium, such as a $TiCl_4$ precursor is pulsed into reaction chamber 120. Other titanium halides, such as $TiI_4$, may be used. The $TiCl_4$ is pulsed into reaction chamber 120 through the gas-distribution fixture 140 onto substrate 110. The flow of the $TiCl_4$ is controlled by mass-flow controller 156 from gas source 151, where the $TiCl_4$ is maintained. In an embodiment, the substrate temperature is maintained at temperature ranging from about 100° C. to about 500° C. by heating element 130. The $TiCl_4$ reacts with the surface of the substrate 110 in the desired region defined by the unmasked areas of the substrate 110. In embodiments, precursors containing titanium may include, but are not limited to $TiCl_4$, $TiI_4$, $Ti(OCH(CH_3)_2)_4$, and/or $Ti(OC_2H_5)_4$.

At 315, a first purging gas is pulsed into the reaction chamber 120. In an embodiment, nitrogen is used as a purging gas and a carrier gas. The nitrogen flow is controlled by mass-flow controller 166 from the purging gas source 161 into the gas conduit 170. Using the pure nitrogen purge avoids overlap of the precursor pulses and possible gas phase reactions. In an embodiment, argon gas or other inert gas may be used as the purging gas. Following the purge, a first oxygen-containing precursor is pulsed into the reaction chamber 120, at 320.

For a titanium sequence using $TiCl_4$ as the precursor, water vapor may be selected as the precursor acting as a reactant to deposit titanium and oxygen on the substrate 110. The $H_2O$ vapor is pulsed into the reaction chamber 120 through gas conduit 170 from gas source 152 by mass-flow controller 157. The water vapor reacts aggressively at the surface of substrate 110.

Following the pulsing of the first oxygen-containing precursor, a second purging gas is injected into the reaction chamber 120, at 325. Nitrogen gas may be used to purge the reaction chamber after pulsing each precursor gas in the titanium/oxygen sequence. In an embodiment, argon gas or other inert gas may be used as the purging gas. Excess precursor gas and reaction by-products are removed from the system by the purge gas, in conjunction with the exhausting of the reaction chamber 120 using vacuum pump 182 through mass-flow controller 187, and exhausting of the gas conduit 170 by the vacuum pump 181 through mass-flow controller 186.

The titanium sequence may be performed a number of times before proceeding to pulse a precursor containing silicon into reaction chamber 120. Various growth rates for titanium oxide may be attained including growth rates from about 0.04 nm/cycle to about 0.075 nm/cycle.

At 330, a precursor containing silicon is pulsed into reaction chamber 120. In an embodiment, $SiCl_4$ is used as the silicon-containing precursor. Other silicon halides, such as SiI$_4$, may be used. The SiCl$_4$ is pulsed to the surface of the substrate 110 through gas-distribution fixture 140 from gas source 153 by mass-flow controller 158. In an embodiment, during pulsing of the SiCl$_4$, the substrate may be held between about 340° C. and about 375° C. by the heating element 130.

At 335, a third purging gas is introduced into the system. In an embodiment following a SiCl$_4$ precursor, nitrogen may be used as a purging and carrier gas. Alternatively, argon may be used as a purging gas. The flow of the third purging gas is controlled by mass-flow controller 167 from the purging gas source 162 into the gas conduit 170 and subsequently into the reaction chamber 120.

At 340, a second oxygen-containing precursor is pulsed into the reaction chamber 120. For a silicon sequence using SiCl$_4$ as the precursor, oxygen, in the form of O$_2$ or O$_3$, may be used as the precursor acting as an oxidizing reactant to interact at the substrate 110. The oxygen is pulsed into the reaction chamber 120 through gas conduit 170 from gas source 154 by mass-flow controller 159. The oxygen reacts aggressively at the surface of substrate 110. In an embodiment, during the oxygen pulsing, substrate 110 may be raised to a temperature significantly higher than the temperature used during the pulsing of the precursor containing silicon. In an embodiment, the temperature for substrate 110 is at about 550° C. during the oxygen pulsing.

At 345, a fourth purging gas is injected into the reaction chamber 120. In an embodiment, nitrogen is used as the fourth purging gas to purge the reaction chamber. Alternatively, argon gas may be used as the fourth purging gas. Excess precursor gas and reaction by-products are removed from the system by the purge gas, in conjunction with the exhausting of the reaction chamber 120 using vacuum pump 182 through mass-flow controller 187, and exhausting of the gas conduit 170 by the vacuum pump 181 through mass-flow controller 186.

At 350, it is determined whether the titanium silicon oxide film is of the desired thickness, t. The thickness of a titanium silicon oxide film after one cycle is determined by the pulsing periods used in the titanium sequence and the silicon sequence at the given temperatures. Typically, at a given temperature, the pulsing periods can vary over a significant range above some minimum pulse time for the precursors, without substantially altering the growth rate. Once a set of periods for one cycle is determined, the growth rate for the titanium silicon oxide film will be set at a value such as N nm/cycle. For a desired titanium silicon oxide film thickness in an application such as forming a gate dielectric of a MOS transistor, the ALD process should be repeated for t/N cycles.

The desired thickness should be completed after t/N cycles. If less than t/N cycles have been completed, the process starts over at 310 with the pulsing of the precursor containing titanium. If t/N cycles have completed, no further ALD processing may be required and the titanium silicon oxide film is completed. Once the total number of cycles to form the desired thickness has been completed, the dielectric film containing the titanium silicon oxide layer may optionally be annealed. In an embodiment, the titanium silicon oxide layer is annealed in a dry oxygen atmosphere at about 400° C. Alternatively, the titanium silicon oxide layer is annealed in a nitrogen atmosphere.

At 360, after forming the titanium silicon oxide layer, processing the device having the dielectric layer containing titanium silicon oxide layer is completed. In an embodiment, completing the device includes further processing of the dielectric layer to include layers of other dielectric materials. In an embodiment, completing the device includes completing the formation of a transistor. In another embodiment, completing the device includes completing the formation of a capacitor. Alternatively, completing the process includes completing the construction of a memory device having an array with access transistors formed with gate dielectrics containing atomic layer deposited titanium silicon oxide layers. Further, in another embodiment, completing the process includes the formation of an electronic system such as an information handling device that uses electronic devices with transistors formed with dielectric films containing an atomic layer deposited titanium silicon oxide layer.

Embodiments for methods having elements similar to the embodiment of FIG. 3 may include numerous permutations for forming the titanium silicon oxide layer. In an embodiment, the silicon sequence is conducted before the titanium sequence. In an embodiment, a titanium/silicon cycle may include a number, x, of titanium sequences and a number, y, of silicon sequences. The number of sequences x, y may be selected to engineer the relative amounts of titanium to silicon. In an embodiment, the number of sequences x and y, along with associated pulsing periods and times, is selected to form a titanium silicon oxide with substantially equal amounts of titanium and silicon. In an embodiment, the number of sequences is selected with x=y. In an embodiment, the number of sequences x and y are selected to form a titanium-rich titanium silicon oxide. Alternatively, the number of sequences x and y are selected to form a silicon-rich titanium silicon oxide. In an embodiment of a method that includes forming a titanium silicon oxide film, an atomic layer deposition sequence includes forming an atomic layer of titanium oxide followed by forming an atomic layer of silicon oxide.

Various embodiments provide an atomic layer deposited titanium silicon oxide films that are amorphous and have smooth interfaces with other layers relative to titanium silicon oxide films formed by other methods such as chemical vapor deposition, sputtering, sol gel, pulsed-laser deposition and reactive magnetron radio frequency sputtering. Processing a titanium silicon oxide film by atomic layer deposition allows for the fabrication of an amorphous dielectric layer, which may avoid increase leakage current through grain boundaries that typically may accompany formation of polycrystalline films. Various embodiments provide a process for growing a dielectric film having a wide range of useful equivalent oxide thickness, $t_{eq}$, associated with a dielectric constant in the range from about 3.9 to about 80. Forming dielectric layers with dielectric constants at the higher range allows the formation of layers with a $t_{eq}$ ranging from about 5 Å to about 20 Å. In an embodiment, a dielectric layer containing a titanium silicon oxide layer has a $t_{eq}$ of less than 5 Å. For applications relating to lower leakage current densities, titanium silicon oxide films may be formed with lower dielectric constants. Titanium silicon oxide films with dielectric constants around 20 may provide dielectrics with relatively low leakage current densities. Lower leakage current densities may be attained with titanium silicon oxide films having dielectric constants less than 10. The dielectric constant and leakage current density characteristics of a dielectric layer containing a titanium silicon oxide film may be controlled by selectively controlling the silicon and titanium content in the titanium silicon oxide film. The leakage current density characteristics of a dielectric layer containing a titanium silicon oxide film may be also be adjusted by selectively regulating the oxygen content in the titanium silicon oxide film. Additionally, the novel process can be implemented to form transistors, capacitors, memory devices, and other electronic systems including information handling devices.

Figure 4:
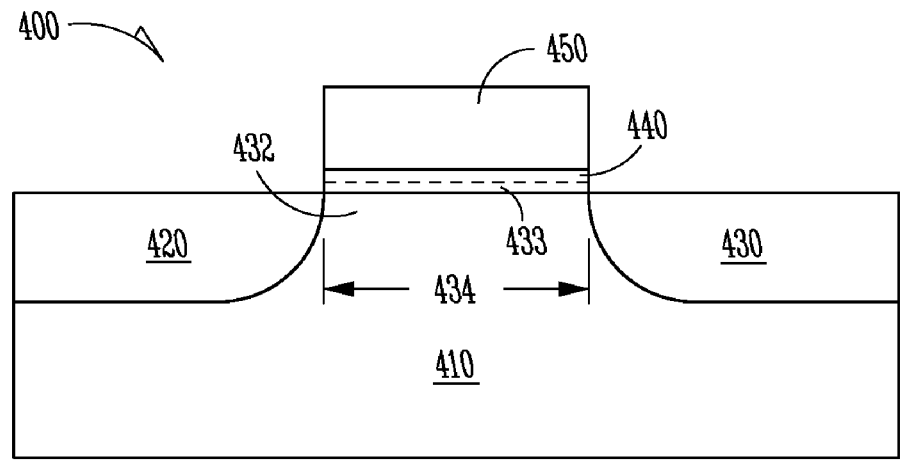
FIG. 4 shows an embodiment of a configuration of a transistor having a dielectric layer containing an atomic layer deposited titanium silicon oxide film.

A transistor 400 as depicted in FIG. 4 may be constructed by forming a source region 420 and a drain region 430 in a silicon based substrate 410 where source and drain regions 420, 430 are separated by a body region 432. Body region 432 defines a channel having a channel length 434. A gate 450 is formed over and contacts gate dielectric 440 disposed on substrate 410. In an embodiment, gate dielectric 440 contains a titanium silicon oxide film. Gate dielectric 440 may be realized as a dielectric layer formed substantially of a titanium silicon oxide film. Gate dielectric 440 may be dielectric layer containing one or more layers of dielectric material in which at least one layer is a titanium silicon oxide film.

An interfacial layer 433 may form between body region 432 and gate dielectric 440. In an embodiment, interfacial layer 433 may be limited to a relatively small thickness compared to gate dielectric 440, or to a thickness significantly less than gate dielectric 440 as to be effectively eliminated. In an embodiment, interfacial layer 433 is substantially without a silicon oxide layer. Forming the substrate, gate, and the source and drain regions may be performed using standard processes known to those skilled in the art. Additionally, the sequencing of the various elements of the process for forming a transistor may be conducted with standard fabrication processes, also as known to those skilled in the art. In an embodiment, gate dielectric 440 may be realized as a gate insulator in a silicon CMOS transistor. Use of such a gate dielectric including a titanium silicon oxide is not limited to silicon based substrates, but may be used with a variety of semiconductor substrates.

Figure 5:
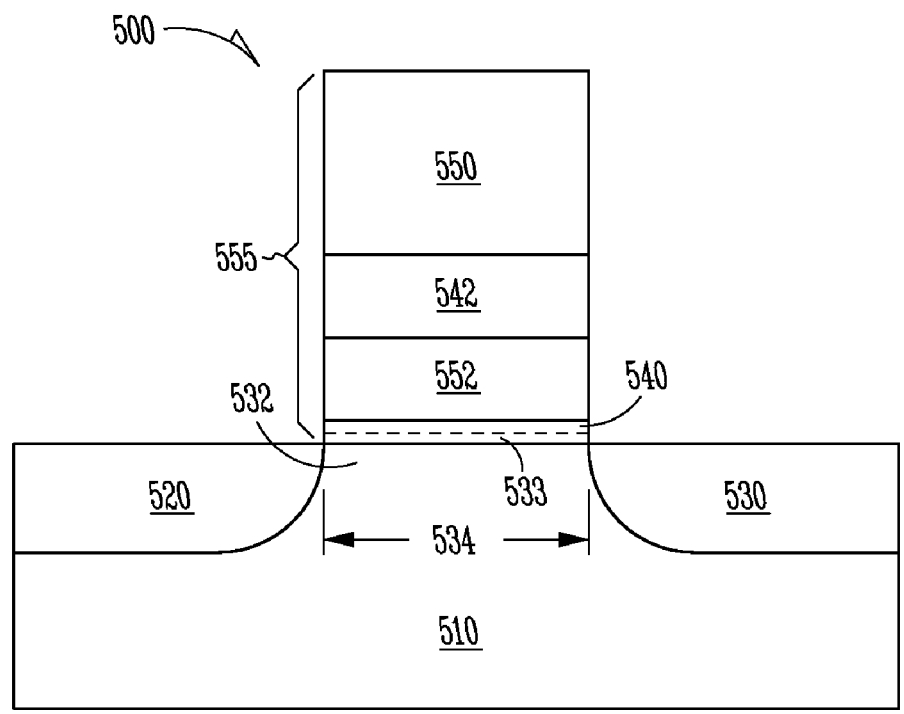
FIG. 5 shows an embodiment of a configuration of a floating gate transistor having a dielectric layer containing an atomic layer deposited titanium silicon oxide film.

FIG. 5 shows an embodiment of a configuration of a floating gate transistor 500 having an insulating layer containing a titanium silicon oxide film. Transistor 500 includes a silicon based substrate 510 with a source 520 and a drain 530 separated by a body region 532. Body region 532 between source 520 and drain 530 defines a channel region having a channel length 534. Located above body region 532 is a stack 555 including a gate dielectric 540, a floating gate 552, a floating gate dielectric 542, and a control gate 550. In an embodiment, floating gate 552 is formed over and contacts gate dielectric 540. An interfacial layer 533 may form between body region 532 and gate dielectric 540. In an embodiment, interfacial layer 533 may be limited to a relatively small thickness compared to gate dielectric 540, or to a thickness significantly less than gate dielectric 540 as to be effectively eliminated. In an embodiment, interfacial layer 533 is substantially without a silicon oxide layer.

In an embodiment, gate dielectric 540 includes a dielectric containing an atomic layer deposited titanium silicon oxide film. Gate dielectric 540 may be realized as a dielectric layer formed substantially of titanium silicon oxide. Gate dielectric 540 may include multiple layers in which at least one layer is substantially titanium silicon oxide. In an embodiment, gate dielectric 540 may include multiple layers where a substantially titanium silicon oxide film contacts body region 532.

In an embodiment, floating gate dielectric 542 includes a dielectric layer having an atomic layer deposited titanium silicon oxide film formed in embodiments similar to those described herein. Floating gate dielectric 542 may be realized as a dielectric layer formed substantially of titanium silicon oxide. Floating gate dielectric 542 may include multiple layers in which at least one layer is substantially titanium silicon oxide. In an embodiment, control gate 550 is formed over and contacts floating gate dielectric 542.

Alternatively, both gate dielectric 540 and floating gate dielectric 542 may be formed as dielectric layers including a titanium silicon oxide film. Gate dielectric 540 and floating gate dielectric 542 may be realized by embodiments similar to those described herein with the remaining elements of the transistor 500 formed using processes known to those skilled in the art.

In an embodiment, gate dielectric 540 forms a tunnel gate insulator and floating gate dielectric 542 forms an inter-gate insulator in flash memory devices, where gate dielectric 540 and/or floating gate dielectric 542 include an insulating layer having an atomic layer deposited titanium silicon oxide. Use of dielectric layers configured in various embodiments is not limited to silicon based substrates, but may be used with a variety of semiconductor substrates.

Figure 6:
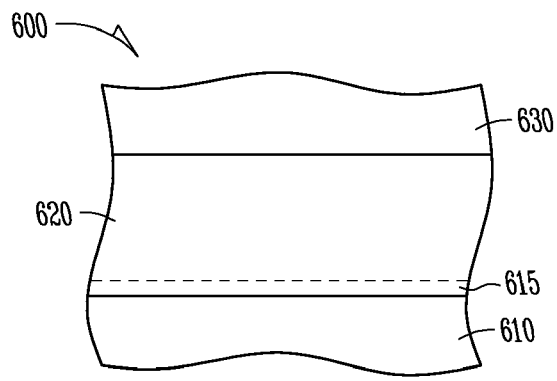
FIG. 6 shows an embodiment of a configuration of a capacitor having a dielectric layer containing an atomic layer deposited titanium silicon oxide film.

The embodiments of methods for forming dielectric layers containing a titanium silicon oxide film may also be applied to forming capacitors in various integrated circuits, memory devices, and electronic systems. In an embodiment for forming a capacitor 600 illustrated in FIG. 6, a method includes forming a first conductive layer 610, forming a dielectric layer 620 containing a titanium silicon oxide film formed by atomic layer deposition on first conductive layer 610, and forming a second conductive layer 630 on dielectric layer 620. Dielectric layer 620 including an insulating layer having a titanium silicon oxide film may be formed using any of the embodiments described herein.

An interfacial layer 615 may form between first conductive layer 610 and dielectric layer 620. In an embodiment, interfacial layer 615 may be limited to a relatively small thickness compared to dielectric layer 620, or to a thickness significantly less than dielectric layer 620 as to be effectively eliminated. In an embodiment, interfacial layer 615 is substantially without a silicon oxide layer.

Dielectric layer 620 may be realized as a dielectric layer formed substantially of titanium silicon oxide. Dielectric layer 620 may include multiple layers in which at least one layer is substantially titanium silicon oxide. In an embodiment, dielectric layer 620 may include multiple layers where a substantially titanium silicon oxide film contacts first conductive layer 610. Embodiments for dielectric layer 620 in a capacitor include, but are not limited to, dielectrics in DRAM capacitors and dielectrics in capacitors in analog, radio frequency (RF), and mixed signal (analog and digital) integrated circuits.

Various embodiments for a dielectric layer containing a titanium silicon oxide film formed by atomic layer deposition may provide for enhanced device performance by providing devices with reduced leakage current. In an embodiment, such improvements in leakage current characteristics may be attained by forming one or more layers of an atomic layer deposited titanium silicon oxide in a nanolaminate structure with other dielectric layers including other metal oxides such as titanium oxide. The transition from one layer of the nanolaminate to another layer of the nanolaminate provides further disruption to a tendency for an ordered structure in the nanolaminate stack. The term "nanolaminate" means a composite film of ultra thin layers of two or more materials in a layered stack. Typically, each layer in a nanolaminate has a thickness of an order of magnitude in the nanometer range. Further, each individual material layer of the nanolaminate may have a thickness as low as a monolayer of the material or as high as 20 nanometers. In an embodiment, a $TiO_x/TiSiO_x$ nanolaminate contains alternating layers of a titanium oxide and a titanium silicon oxide.

Figure 7:
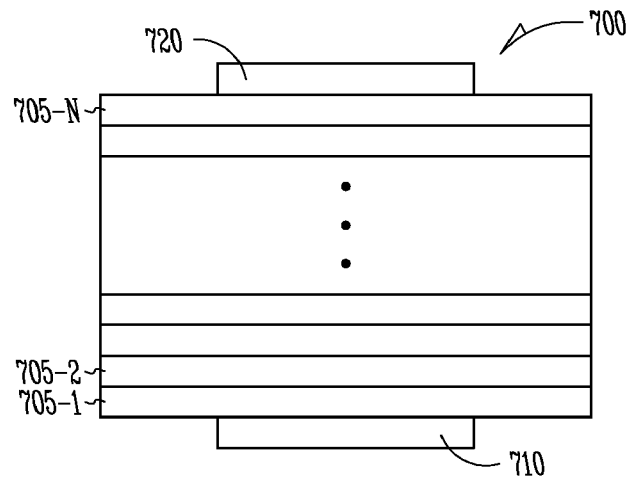
FIG. 7 depicts an embodiment of a dielectric layer including a nanolaminate having at least one layer containing an atomic layer deposited titanium silicon oxide film.

FIG. 7 depicts a nanolaminate structure 700 for an embodiment of a dielectric structure including an atomic layer deposited titanium silicon oxide film. In an embodiment, nanolaminate structure 700 includes a plurality of layers 705-1, 705-2 to 705-N, where at least one layer contains a titanium silicon oxide film formed according to an embodiment herein. The other layers may be other dielectric layers or dielectric metal oxides. The sequencing of the layers depends on the application. In an embodiment, an atomic layer deposited titanium silicon oxide film is the first layer formed on a substrate. In an embodiment, nanolaminate structure 700 contains an atomic layer deposited titanium silicon oxide film in contact with conductive contact 710 and/or conductive contact 720. The effective dielectric constant associated with nanolaminate structure 700 is that attributable to N capacitors in series, where each capacitor has a thickness defined by the thickness of the corresponding layer. By selecting each thickness and the composition of each layer, a nanolaminate structure can be engineered to have a predetermined dielectric constant. Embodiments for structures such as nanolaminate structure 700 may be used as nanolaminate dielectrics in NROM flash memory devices as well as other integrated circuits. In an embodiment, a layer of the nanolaminate structure 700 is used to store charge in the NROM device. The charge storage layer of a nanolaminate structure 700 in an NROM device may be, but is not limited to, a silicon oxide layer, a silicon nitride layer, or other nitride layer.

Transistors, capacitors, and other devices having dielectric films containing an atomic layer deposited titanium silicon oxide film formed by the methods described above may be implemented into memory devices and electronic systems including information handling devices. Embodiments of these information handling devices may include wireless systems, telecommunication systems, and computers. Further, embodiments of electronic devices having dielectric films containing a titanium silicon oxide film may be realized as integrated circuits.

Figure 8:
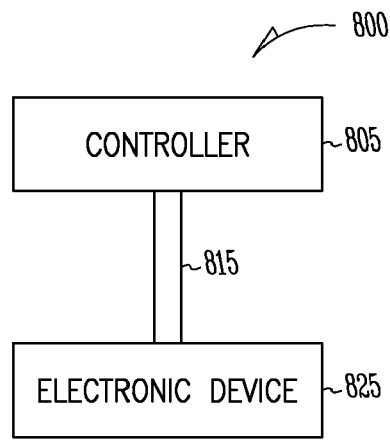
FIG. 8 is a simplified diagram for an embodiment of a controller coupled to an electronic device, where at least one of the controller or the electronic device has a dielectric layer containing an atomic layer deposited titanium silicon oxide film.

FIG. 8 illustrates a diagram for an electronic system 800 having one or more devices having a dielectric layer containing an atomic layer deposited titanium silicon oxide film fabricated according to various embodiments. Electronic system 800 includes a controller 805, a bus 815, and an electronic device 825, where bus 815 provides electrical conductivity between controller 805 and electronic device 825. In various embodiments, controller 805 and/or electronic device 825 include an embodiment for a dielectric layer having a titanium silicon oxide film formed by atomic layer deposition as previously discussed herein. Electronic system 800 may include, but is not limited to, information handling devices, wireless systems, telecommunication systems, fiber optic systems, electro-optic systems, and computers.

Figure 9:
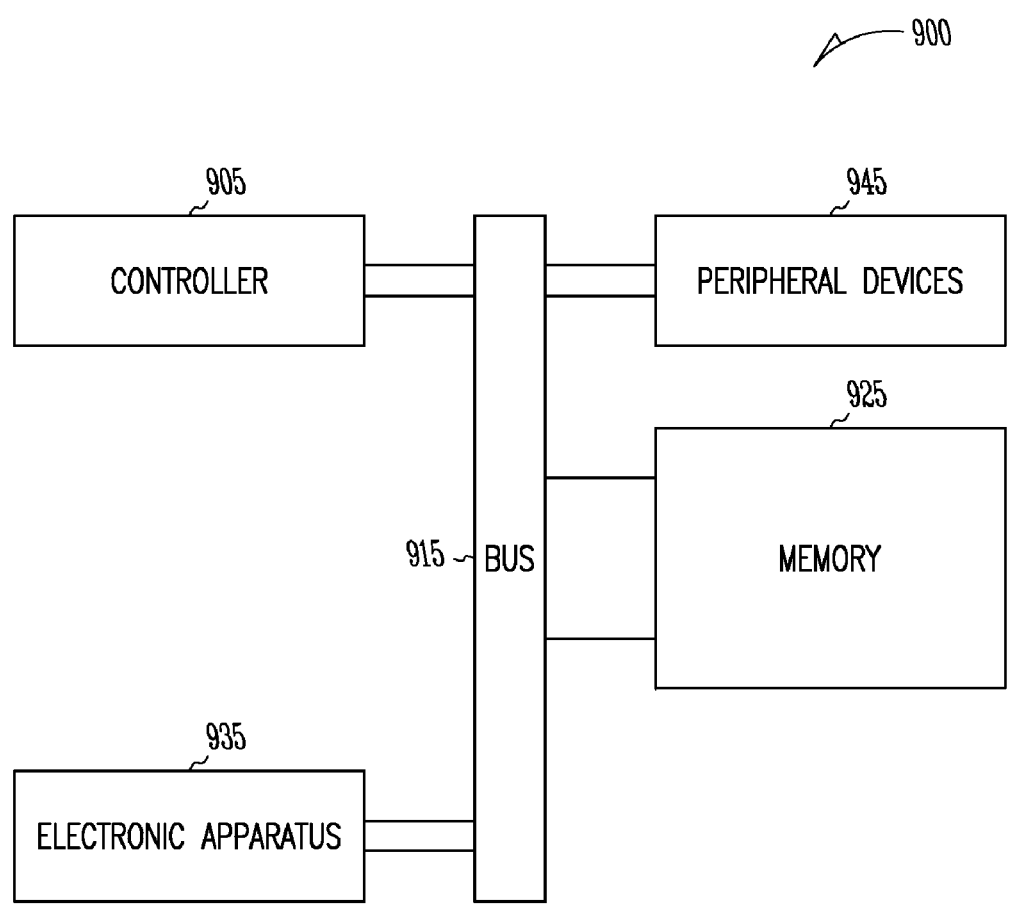
FIG. 9 illustrates a diagram for an embodiment of an electronic system having one or more devices with a dielectric layer containing an atomic layer deposited titanium silicon oxide film.

FIG. 9 depicts a diagram of an embodiment of a system 900 having a controller 905 and a memory 925. Controller 905 and/or memory 925 may include a dielectric layer having an atomic layer deposited titanium silicon oxide film fabricated according to various embodiments. System 900 also includes an electronic apparatus 935, and a bus 915, where bus 915 provides electrical conductivity between controller 905 and electronic apparatus 935, and between controller 905 and memory 925. Bus 915 may include an address, a data bus, and a control bus, each independently configured. Alternatively, bus 915 may use common conductive lines for providing address, data, and/or control, the use of which is regulated by controller 905. In an embodiment, electronic apparatus 935 may be additional memory configured similar to memory 925. An embodiment may include an additional peripheral device or devices 945 coupled to bus 915. In an embodiment, controller 905 is a processor. Any of controller 905, memory 925, bus 915, electronic apparatus 935, and peripheral devices 945 may include a dielectric layer including a titanium silicon oxide film formed according to various embodiments. System 900 may include, but is not limited to, information handling devices, telecommunication systems, and computers.

Peripheral devices 945 may include displays, additional storage memory, or other control devices that may operate in conjunction with controller 905. Alternatively, peripheral devices 945 may include displays, additional storage memory, or other control devices that may operate in conjunction with controller 905 and/or memory 925.

Memory 925 may be realized as a memory device containing a dielectric layer including a titanium silicon oxide film formed according to various embodiments. It will be understood that embodiments are equally applicable to any size and type of memory circuit and are not intended to be limited to a particular type of memory device. Memory types include a DRAM, SRAM (Static Random Access Memory) or Flash memories. Additionally, the DRAM could be a synchronous DRAM commonly referred to as SGRAM (Synchronous Graphics Random Access Memory), SDRAM (Synchronous Dynamic Random Access Memory), SDRAM II, and DDR SDRAM (Double Data Rate SDRAM), as well as Synchlink or Rambus DRAMs and other emerging DRAM technologies.

Formation of dielectric layers containing a titanium silicon oxide film formed by atomic layer deposition, processed in relatively low temperatures, may be amorphous and possess smooth surfaces. Such titanium silicon oxide films can provide enhanced electrical properties due to their smoother surface, resulting in reduced leakage current. Additionally, such dielectric layers provide a significantly thicker physical thickness than a silicon oxide layer having the same equivalent oxide thickness, where the increased thickness would also reduce leakage current. These properties of embodiments of dielectric layers allow for application as dielectric layers in numerous electronic devices and systems.

Capacitors, transistors, higher level ICs or devices including memory devices, and electronic systems are constructed utilizing the novel process for forming a dielectric film having an ultra thin equivalent oxide thickness, $t_{eq}$. Gate dielectric layers or films including an atomic layer deposited titanium silicon oxide film may be formed having a dielectric constant (κ) substantially higher than that of silicon oxide. These dielectric films are capable of a $t_{eq}$ thinner than $SiO_2$ gate dielectrics of the same physical thickness. Alternatively, the high dielectric constant relative to silicon dioxide allows the use of much larger physical thickness of these high-κ dielectric materials for the same $t_{eq}$ of $SiO_2$. Forming the relatively larger thickness aids in processing gate dielectrics and other dielectric layers in electronic devices and systems.

Although specific embodiments have been illustrated and described herein, it will be appreciated by those of ordinary skill in the art that any arrangement that is calculated to achieve the same purpose may be substituted for the specific embodiments shown. This application is intended to cover any adaptations or variations of embodiments of the present invention. It is to be understood that the above description is intended to be illustrative, and not restrictive, and that the phraseology or terminology employed herein is for the purpose of description and not of limitation. Combinations of the above embodiments and other embodiments will be apparent to those of skill in the art upon studying the above description. The scope of the present invention includes any other applications in which embodiment of the above structures and fabrication methods are used. The scope of the embodiments of the present invention should be determined with reference to the appended claims, along with the full scope of equivalents to which such claims are entitled.

What is claimed is:

1. A method comprising:
   forming a film of titanium silicon oxide by a monolayer or partial monolayer sequencing process, the titanium silicon oxide being $Ti_xSi_yO_z$ with x>0, y>0, and z>0, the forming of the titanium silicon oxide by the monolayer or partial monolayer sequencing process including
      pulsing a titanium-containing precursor independently from pulsing a silicon-containing precursor with a purge process between pulsing the titanium-containing precursor and pulsing the silicon-containing precursor; and
      pulsing a first oxygen reactant precursor for reaction after pulsing the titanium-containing precursor separate from pulsing a second oxygen reactant precursor for reaction after pulsing the silicon-containing precursor; and
   incorporating an amount of oxygen in the film of titanium silicon oxide to set a specified characteristic for the film of titanium silicon oxide.

2. The method of claim 1, wherein the monolayer or partial monolayer process sequencing process is a self-limiting process.

3. The method of claim 1, wherein incorporating the amount of oxygen in the film of titanium silicon oxide includes regulating the amount of oxygen such that the film of titanium silicon oxide has a specified leakage current characteristic.

4. The method of claim 1, wherein incorporating the amount of oxygen in the film of titanium silicon oxide includes regulating the amount of oxygen to a level to control oxygen vacancies in the film of titanium silicon oxide.

5. The method of claim 1, wherein incorporating the amount of oxygen in the film of titanium silicon oxide includes controlling distribution of oxygen vacancies in the film.

6. The method of claim 1, wherein incorporating the amount of oxygen in the film of titanium silicon oxide includes controlling pulsing sequences of precursors containing titanium and precursors containing silicon, controlling pulse time of an oxygen containing precursor, and controlling an environment of the substrate on which the film of titanium silicon oxide is being formed to regulate the amount of oxygen in the film of titanium silicon oxide.

7. The method of claim 1, wherein forming the film of titanium silicon oxide by the monolayer or partial monolayer sequencing process includes using titanium and silicon precursors that are substantially without oxygen content.

8. The method of claim 1, wherein forming the film of titanium silicon oxide by the monolayer or partial monolayer sequencing process includes using an organometallic titanium precursor.

9. The method of claim 1, wherein forming the film of titanium silicon oxide by the monolayer or partial monolayer sequencing process includes using a silicon precursor containing oxygen.

10. The method of claim 1, wherein forming the film of titanium silicon oxide by the monolayer or partial monolayer sequencing process includes using a silicon precursor, the silicon precursor having a structure represented by SiR, and using a titanium precursor, the titanium precursor having a structure represented by TiR, R representing a compound such that SiR and TiR are useable as atomic layer deposition precursors.

11. The method of claim 1, wherein the method includes annealing the film of titanium silicon oxide in a dry oxygen atmosphere.

12. The method of claim 1, wherein the method includes annealing the film of titanium silicon oxide in a nitrogen atmosphere.

13. A method comprising:
   forming a dielectric structure having a plurality of dielectric materials, the plurality of dielectric materials including a film of titanium silicon oxide, the titanium silicon oxide being $Ti_xSi_yO_z$ with x>0, y>0, and z>0;
   forming the film of titanium silicon oxide by a monolayer or partial monolayer sequencing process, the forming of the titanium silicon oxide by the monolayer or partial monolayer sequencing process including
      pulsing a titanium-containing precursor independently from pulsing a silicon-containing precursor with a purge process between pulsing the titanium-containing precursor and pulsing the silicon-containing precursor; and
      pulsing a first oxygen reactant precursor for reaction after pulsing the titanium-containing precursor separate from pulsing a second oxygen reactant precursor for reaction after pulsing the silicon-containing precursor;
   incorporating an amount of oxygen in the film of titanium silicon oxide to set a specified characteristic for the titanium silicon oxide; and
   forming a conductive material contacting the dielectric structure.

14. The method of claim 13, wherein forming the dielectric structure includes forming an insulating metal oxide in addition to forming the titanium silicon oxide.

15. The method of claim 14, wherein forming the insulating metal oxide includes forming titanium oxide.

16. A method comprising:
   forming a dielectric structure having a plurality of dielectric materials, the plurality of dielectric materials including a film of titanium silicon oxide;
   forming the film of titanium silicon oxide by a monolayer or partial monolayer sequencing process;
   incorporating an amount of oxygen in the film of titanium silicon oxide to set a specified characteristic for the titanium silicon oxide; and
   forming a conductive material contacting the dielectric structure, wherein forming the dielectric structure includes forming an insulating nitride.

17. A method comprising:
   forming a memory array containing a film of titanium silicon oxide, the titanium silicon oxide being $Ti_xSi_yO_z$ with x>0, y>0, and z>0;
   forming the film of titanium silicon oxide by a monolayer or partial monolayer sequencing process, the forming of the titanium silicon oxide by the monolayer or partial monolayer sequencing process including
      pulsing a titanium-containing precursor independently from pulsing a silicon-containing precursor with a purge process between pulsing the titanium-containing precursor and pulsing the silicon-containing precursor; and
      pulsing a first oxygen reactant precursor for reaction after pulsing the titanium-containing precursor separate from pulsing a second oxygen reactant precursor for reaction after pulsing the silicon-containing precursor; and
   incorporating an amount of oxygen in the film of titanium silicon oxide to set a specified characteristic for the titanium silicon oxide.

18. The method of claim 17, wherein the method includes forming the film of titanium silicon oxide in a transistor above a channel of the transistor, the channel coupling a source region with a drain region.

19. The method of claim 17, wherein the method includes forming a nanolaminate containing the film of titanium silicon oxide and forming the nanolaminate having a charge storage material in the nanolaminate.

20. A method comprising:
forming a memory array containing a film of titanium silicon oxide;
forming the film of titanium silicon oxide by a monolayer or partial monolayer sequencing process;
incorporating an amount of oxygen in the film of titanium silicon oxide to set a specified characteristic for the titanium silicon oxide; and
forming a nanolaminate containing the film of titanium silicon oxide and forming the nanolaminate having a charge storage material in the nanolaminate, wherein forming the nanolaminate includes forming silicon oxide, silicon nitride, or an insulating nitride other than silicon nitride as the charge storage material of the memory array.

* * * * *